(12) United States Patent
Takimoto et al.

(10) Patent No.: US 9,281,486 B2
(45) Date of Patent: Mar. 8, 2016

(54) SEMICONDUCTOR DEVICE, METHOD OF MANUFACTURING SEMICONDUCTOR DEVICE, SOLID-STATE IMAGING UNIT, AND ELECTRONIC APPARATUS

(71) Applicant: Sony Corporation, Tokyo (JP)

(72) Inventors: Kaori Takimoto, Kanagawa (JP); Tetsuji Yamaguchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/366,054

(22) PCT Filed: Nov. 20, 2012

(86) PCT No.: PCT/JP2012/080064
§ 371 (c)(1),
(2) Date: Jun. 17, 2014

(87) PCT Pub. No.: WO2013/099475
PCT Pub. Date: Jul. 4, 2013

(65) Prior Publication Data
US 2014/0353651 A1    Dec. 4, 2014

(30) Foreign Application Priority Data
Dec. 27, 2011  (JP) ................. 2011-285353

(51) Int. Cl.
*H01L 51/44* (2006.01)
*H01L 27/30* (2006.01)

(52) U.S. Cl.
CPC ........... *H01L 51/448* (2013.01); *H01L 27/307* (2013.01); *H01L 51/441* (2013.01); *Y02E 10/549* (2013.01); *Y02P 70/521* (2015.11)

(58) Field of Classification Search
USPC ........................................... 257/40
See application file for complete search history.

(56) References Cited

U.S. PATENT DOCUMENTS

| | | | | |
|---|---|---|---|---|
| 6,243,155 | B1 * | 6/2001 | Zhang et al. | 349/199 |
| 2010/0194941 | A1 * | 8/2010 | Maehara et al. | 348/281 |
| 2010/0301314 | A1 * | 12/2010 | Aso et al. | 257/40 |
| 2012/0205646 | A1 * | 8/2012 | Cho et al. | 257/43 |
| 2015/0001503 | A1 * | 1/2015 | Hirose | 257/40 |
| 2015/0024221 | A1 * | 1/2015 | Watanabe et al. | 428/446 |
| 2015/0129861 | A1 * | 5/2015 | Hamano et al. | 257/40 |

FOREIGN PATENT DOCUMENTS

| | | |
|---|---|---|
| JP | 2003-332551 | 11/2003 |
| JP | 2007-59487 | 3/2007 |
| JP | 2007-059516 | 3/2007 |
| JP | 2011-029337 | 2/2011 |

* cited by examiner

*Primary Examiner* — Thao P Le
(74) *Attorney, Agent, or Firm* — Hazuki International, LLC

(57) ABSTRACT

A semiconductor device includes, in order on a substrate, an organic semiconductor layer, an inorganic film, and a protective film. The inorganic film and the protective film each have a peripheral edge portion that is formed in an outer region compared to a peripheral edge portion of the organic semiconductor layer.

14 Claims, 27 Drawing Sheets

SEMICONDUCTOR DEVICE, METHOD OF MANUFACTURING SEMICONDUCTOR DEVICE, SOLID-STATE IMAGING UNIT, AND ELECTRONIC APPARATUS

TECHNICAL FIELD

The present disclosure relates to a semiconductor device such as an organic photoelectric conversion device, to a method of manufacturing a semiconductor device, to a solid-state imaging unit, and to an electronic apparatus.

BACKGROUND ART

In recent years, reduction in pixel size has been proceeding in a solid-state imaging unit such as a CCD (Charge Coupled Device) image sensor or a CMOS (Complementary Metal Oxide Semiconductor) image sensor. Accordingly, the number of photons entering a unit pixel decreases. Therefore, sensitivity is decreased, and S/N ratio is decreased. Further, when a color filter configured of primary-color filters of red, green, and blue that are arranged two-dimensionally is used for colorization, green and blue lights are absorbed by the color filter in a red pixel. This results in decrease in sensitivity. Moreover, an interpolation process is performed between the pixels when generating each color signal. This results in occurrence of so-called false color.

Therefore, there is proposed a solid-state imaging unit in which three photoelectric conversion layers are laminated in one pixel, and photoelectric conversion of red light, green light, and blue light is performed in the respective photoelectric conversion layers to obtain signals of three colors in one pixel (for example, Patent Literature 1). In Patent Literature 1, for example, an organic photoelectric conversion section that detects green light and generates a signal electric charge in correspondence therewith is provided on a silicon substrate. Also, photodiodes (inorganic photoelectric conversion sections) that detect respective red and blue light are provided in the silicon substrate.

Also, Patent Literature 2 proposes a structure that achieves a laminated structure of the organic photoelectric conversion section and the inorganic photoelectric conversion section as described above in a so-called back-illumination-type solid-state imaging unit. In the back-illumination-type solid-state imaging unit, a circuit and a multi-layered structure of wirings (hereinafter, simply referred to as "wiring layer") are formed on a surface of the silicon substrate opposite from a light receiving surface. Therefore, the organic photoelectric conversion section is allowed to be provided on the silicon substrate (the inorganic photoelectric conversion section) with no wiring layer in between. Therefore, in a pixel, a distance between the organic photoelectric conversion section and the inorganic photoelectric conversion section is allowed to be shorter. Therefore, it is possible to reduce variations in sensitivity between colors resulting depending on an F-number of an on-chip lens.

CITATION LIST

Patent Literature

Patent Literature 1: Japanese Unexamined Patent Application Publication No. 2003-332551
Patent Literature 2: Japanese Unexamined Patent Application Publication No. 2011-29337

SUMMARY OF THE INVENTION

As in Patent Literatures 1 and 2 described above, the solid-state imaging unit including the organic photoelectric conversion section has a structure in which an organic semiconductor layer having a photoelectric conversion function is sandwiched by a pair of electrodes that are configured of inorganic films. In a semiconductor device that has such a laminated structure of the organic semiconductor layer and the inorganic films, it is desired to form the organic semiconductor layer without loss, and to achieve improvement in yield and reliability.

Therefore, it is desirable to provide a semiconductor, a method of manufacturing the semiconductor, a solid-state imaging unit, and an electronic apparatus that have a laminated structure of an organic semiconductor layer and an inorganic film and are capable of improving yield and reliability.

A semiconductor device according to an embodiment of the present disclosure includes, in order on a substrate, an organic semiconductor layer, an inorganic film, and a protective film. The inorganic film and the protective film each have a peripheral edge portion that is formed in an outer region compared to a peripheral edge portion of the organic semiconductor layer.

A method of manufacturing a semiconductor device according to an embodiment of the present disclosure includes: forming an organic semiconductor layer on a substrate; forming an inorganic film and a protective film in order on the organic semiconductor layer; and selectively removing part of the inorganic film and part of the protective film in an outer region compared to a peripheral edge portion of the organic semiconductor layer, and thereby processing the inorganic film.

In the method of manufacturing the semiconductor device according to an embodiment of the present disclosure, after forming the inorganic film and the protective film in order on the organic semiconductor layer, processing of the inorganic film is performed in an outer region compared to the peripheral edge of the organic semiconductor layer. Here, when the processing is performed by a photolithography method, washing using chemical solution is performed after the processing. However, by forming the protective film on the inorganic film and patterning the inorganic film in an outer region compared to the peripheral edge portion of the organic semiconductor layer, the organic layer is not exposed in the washing step. Therefore, damage in the organic semiconductor layer is suppressed.

A solid-state imaging unit according to an embodiment of the present disclosure includes pixels each including one or a plurality of organic photoelectric conversion sections. The one or the plurality of organic photoelectric conversion sections each include, in order on a substrate, a first electrode, an organic semiconductor layer having a photoelectric conversion function, a second electrode, and a protective film. The inorganic film and the protective film each have a peripheral edge portion that is formed in an outer region compared to a peripheral edge portion of the organic semiconductor layer.

An electronic apparatus according to an embodiment of the present disclosure includes the above-described solid-state imaging unit of the present disclosure.

According to the method of manufacturing the semiconductor device of an embodiment of the present disclosure, the inorganic film and the protective film are formed in order on the organic semiconductor layer, and then, the inorganic film is selectively removed in an outer region compared to the peripheral edge of the organic semiconductor layer. Accordingly, the organic semiconductor is not exposed and damage in the organic semiconductor layer is suppressed at the time of processing the inorganic film. Therefore, it is possible to provide the laminated structure of the organic semiconductor layer and the inorganic film, and to improve yield and reliability.

According to the semiconductor device according to an embodiment of the present disclosure, the organic semiconductor layer, the inorganic film, and the protective film are provided in order on the substrate, and the peripheral edge portions of the inorganic film and the protective film are each formed in a an outer region compared to the peripheral edge portion of the organic semiconductor layer. Therefore, damage in the organic semiconductor layer is allowed to be suppressed in a manufacturing process. Therefore, it is possible to improve yield and reliability in the semiconductor device that has the laminated structure of the organic semiconductor layer and the inorganic film.

According to the solid-state imaging unit and the electronic apparatus according to an embodiment of the present disclosure, in the organic photoelectric conversion section in each pixel, the first electrode, the organic semiconductor layer having the photoelectric conversion function, the second electrode, and the protective film are provided in order on the substrate, and the peripheral edge portions of the inorganic film and the protective film are each formed in an outer region compared to the peripheral edge portion of the organic semiconductor layer. Therefore, damage in the organic semiconductor layer is allowed to be suppressed in the manufacturing process. Therefore, it is possible to improve yield and reliability in the solid-state imaging unit and the electronic apparatus that have the laminated structure of the organic semiconductor layer and the inorganic film (the second electrode) in the pixel.

MODES FOR CARRYING OUT THE INVENTION

Figure 1:
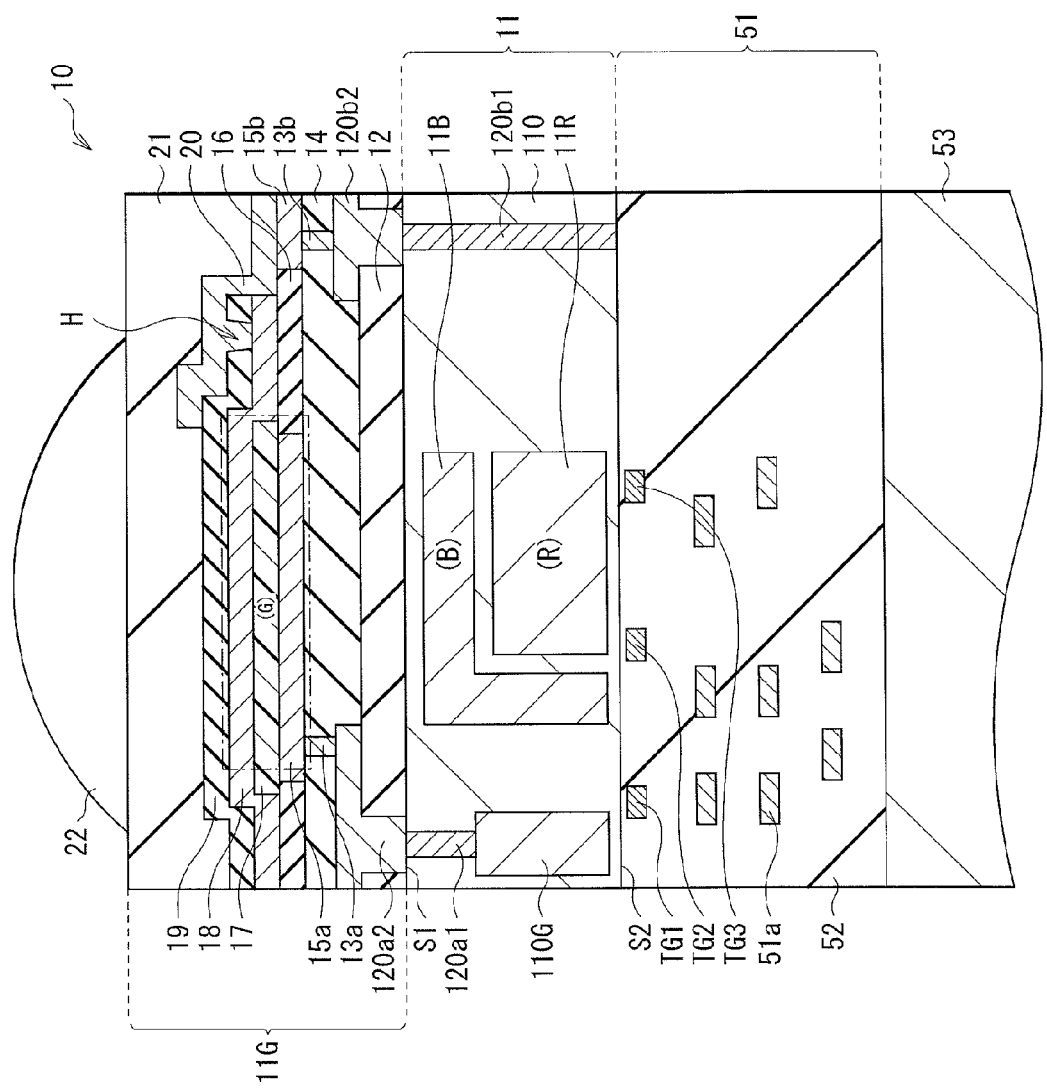
FIG. 1 is a cross-sectional view illustrating a schematic configuration of a semiconductor device (a photoelectric conversion device) according to an embodiment of the present disclosure.

An embodiment of the present disclosure will be described below in detail referring to the drawings. It is to be noted that the order of description will be as follows.
1. Embodiment (An example of a photoelectric conversion device in which an organic photoelectric conversion section and an inorganic photoelectric conversion section are laminated)
2. Modification 1 (Another example of a method of forming an upper electrode)
3. Modification 2 (An example in which a tapered portion is formed in an end portion of the upper electrode)
4. Modification 3 (Another example of a method of forming an insulating film)
5. Modification 4 (An example of a case where a hole is extracted as a signal electric charge from a lower electrode side)
6. Modification 5 (An example of a case where an electron/a hole is extracted as a signal electric charge from an upper electrode side)
7. Application Example 1 (An example of a solid-state imaging unit)
8. Application Example 2 (An example of an electronic apparatus (a camera))

1. Embodiment

[Configuration]

FIG. 1 illustrates a cross-sectional configuration of a semiconductor device (a photoelectric conversion device 10) of an embodiment of the present disclosure. The photoelectric conversion device 10 may configure, for example, one pixel in a solid-state imaging unit (which will be described later) such as a CCD image sensor and a CMOS image sensor.

In the photoelectric conversion device 10, pixel transistors (including transfer transistors Tr1 to Tr3 which will be described later) are formed and a multi-layered wiring layer (a multi-layered wiring layer 51) is provided on a front face (a surface S2 on an opposite side from a light receiving surface) side of a semiconductor substrate 11.

This photoelectric conversion device 10 has a structure in which an organic photoelectric conversion section and an inorganic photoelectric conversion section are laminated in a vertical direction. The organic photoelectric conversion section and the inorganic photoelectric conversion section selectively detect light having wavelength ranges different from each other and perform photoelectric conversion thereon. Accordingly, in the solid-state imaging unit which will be described later, it is possible to obtain a plurality of types of color signals in one pixel without using a color filter. In the present embodiment, the photoelectric conversion device 10 has a laminated structure of one organic photoelectric conversion section 11G and two inorganic photoelectric conversion sections 11B and 11R. The photoelectric conversion device 10 thereby obtains the respective color signals of red (R), green (G), and blue (B). Specifically, the organic photoelectric conversion section 11G is formed on a back face (a surface 51) of the semiconductor substrate 11. The inorganic photoelectric conversion sections 11B and 11R are formed to be embedded in the semiconductor substrate 11. Configurations of the respective sections will be described below.

[Semiconductor Substrate 11]

In the semiconductor substrate 11, the inorganic photoelectric conversion sections 11B and 11R and a green electric storage layer 110G are formed to be embedded, for example, in a predetermined region of an n-type silicon (Si) layer 110. Also, electrically-conductive plugs 120a1 and 120b1 are embedded in the semiconductor substrate 11. The electrically-conductive plugs 120a1 and 120b1 are to serve as a transmission path of an electric charge (an electron or a hole) from the organic photoelectric conversion section 11G. In the present embodiment, the back face (the surface S1) of this semiconductor substrate 11 serves as the light receiving surface. On the front face (the surface S2) side of the semiconductor substrate 11, a plurality of pixel transistors (including the transfer transistors Tr1 to Tr3) corresponding to the respective organic photoelectric conversion section 11G and inorganic photoelectric conversion sections 11B and 11R are formed, and a peripheral circuit configured of a logic circuit, etc. is formed.

As the pixel transistor, for example, a transfer transistor, a reset transistor, an amplifying transistor, and a selection transistor may be mentioned. Each of these transistors may be configured, for example, of an MOS transistor, and is formed in a p-type semiconductor well region on the surface S2 side. A circuit that includes such pixel transistors is formed for each of the photoelectric conversion sections for red, green, and blue. Each circuit may have a three-transistor configuration that includes three transistors in total that may be configured, for example, of the transfer transistor, the reset transistor, and the amplifying transistor out of these pixel transistors. Each circuit may have a four-transistor configuration that includes the selection transistor in addition thereto. Here, out of these pixel transistors, only the transfer transistors Tr1 to Tr3 are illustrated and described. It is to be noted that the pixel transistor other than the transfer transistor may be shared by the photoelectric conversion sections or by the pixels. Further, a so-called a pixel-shared structure may be also adopted in which a floating diffusion is shared.

The transfer transistors Tr1 to Tr3 are each configured to include a gate electrode (a gate electrode TG1, TG2, or TG3) and a floating diffusion (FD113, FD114, or FD116). The transfer transistor Tr1 transfers, to a vertical signal line Lsig which will be described later, a signal electric charge (an electron, in the present embodiment) corresponding to green that is generated in the organic photoelectric conversion section 11G and is accumulated in the green electric storage layer 110G. The transfer transistor Tr2 transfers, to the vertical signal line Lsig which will be described later, a signal electric charge (an electron, in the present embodiment) corresponding to blue that is generated and accumulated in the inorganic photoelectric conversion section 11B. Similarly, the transfer transistor Tr3 transfers, to the vertical signal line Lsig which will be described later, a signal electric charge (an electron, in the present embodiment) corresponding to red that is generated and accumulated in the inorganic photoelectric conversion section 11R.

The inorganic photoelectric conversion sections 11B and 11R are each a photodiode that has a pn junction. The inorganic photoelectric conversion sections 11B and 11R are formed in order from the surface S1 side on an optical path in the semiconductor substrate 11. Out of these, the inorganic photoelectric conversion section 11B selectively detects blue light and accumulates a signal electric charge corresponding to blue. The inorganic photoelectric conversion section 11B may be formed to extend, for example, from a selective region along the surface S1 of the semiconductor substrate 11 to a region near an interface with the multi-layered wiring layer 51. The inorganic photoelectric conversion section 11R selectively detects red light and accumulates a signal electric charge corresponding to red. The inorganic photoelectric conversion section 11R may be formed, for example, in a region in a lower layer (on the surface S2 side) compared to the inorganic photoelectric conversion section 11B. It is to be noted that blue (B) may be a color that corresponds to a wavelength range from 450 nm to 495 nm, for example, and red (R) may be a color that corresponds to a wavelength range from 620 nm to 750 nm, for example. It is enough that the inorganic photoelectric conversion sections 11B and 11R are capable of detecting light in part or all of the respective wavelength ranges.

Figure 2A:
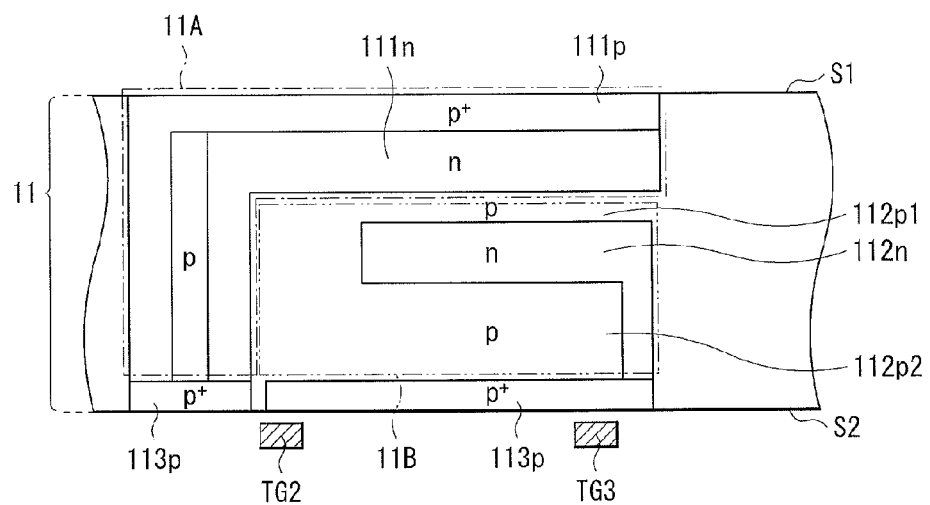
FIG. 2A is a cross-sectional view illustrating a configuration example of an inorganic photoelectric conversion section.
Figure 2B:
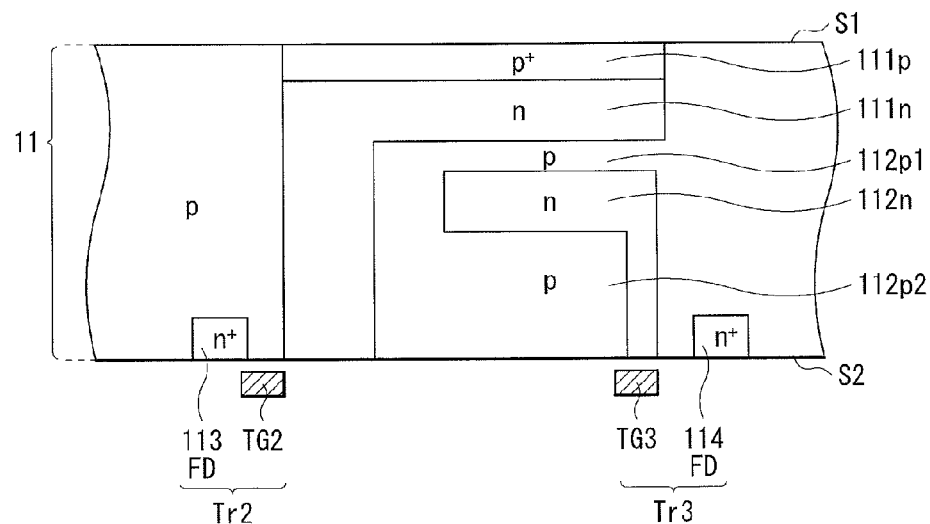
FIG. 2B is a cross-sectional view illustrating a configuration example of the inorganic photoelectric conversion section.

FIG. 2A illustrates a detailed configuration example of the inorganic photoelectric conversion sections 11B and 11R. FIG. 2B corresponds to a configuration in another cross-section in FIG. 2A. It is to be noted that, in the present embodiment, description will be provided of a case where, out of a pair of an electron and a hole generated by photoelectric conversion, the electron is read as a signal electric charge (a case where an n-type semiconductor region serves as a photoelectric conversion layer). Further, in the drawing, "+(plus)" attached above "p" or "n" represents that p-type or n-type impurity concentration is high. Also, out of the pixel transistors, the gate electrodes TG2 and TG3 of the transfer transistors Tr2 and Tr3 are shown.

The inorganic photoelectric conversion section 11B may be configured to include, for example, a p-type semiconductor region (hereinafter, simply referred to as "p-type region", and the same is applicable to the case of n-type) 111p to be a hole accumulation layer, and an n-type photoelectric conversion layer (an n-type region) 111n to be an electron accumulation layer. The p-type region 111p and the n-type photoelectric conversion layer 111n are each formed in a selective region near the surface S1. Part of each of the p-type region 111p and the n-type photoelectric conversion layer 111n is bent and formed to extend to reach the interface with the surface S2. The p-type region 111p is connected to a p-type semiconductor well region which is not illustrated on the surface S1 side. The n-type photoelectric conversion layer 111n is connected to the FD 113 (an n-type region) of the transfer transistor Tr2 for blue. It is to be noted that a p-type region 113p (a hole accumulation layer) is formed near an interface of the surface S2 and each of the end portions on the surface S2 side of the p-type region 111p and the n-type photoelectric conversion layer 111n.

The inorganic photoelectric conversion section 11R may be formed, for example, of an n-type photoelectric conversion layer 112n (an electron accumulation layer) sandwiched between p-type regions 112p1 and 112p2 (hole accumulation layers) (has a p-n-p laminated structure). Part of the n-type photoelectric conversion layer 112n is bent and formed to extend to reach the interface with the surface S2. The n-type photoelectric conversion layer 112n is connected to the FD 114 (an n-type region) of the transfer transistor Tr3 for red. It is to be noted that a p-type region 113p (a hole accumulation layer) is formed at least near an interface of the surface S2 and an end portion on the surface S2 side of the n-type photoelectric conversion layer 111n.

Figure 3:
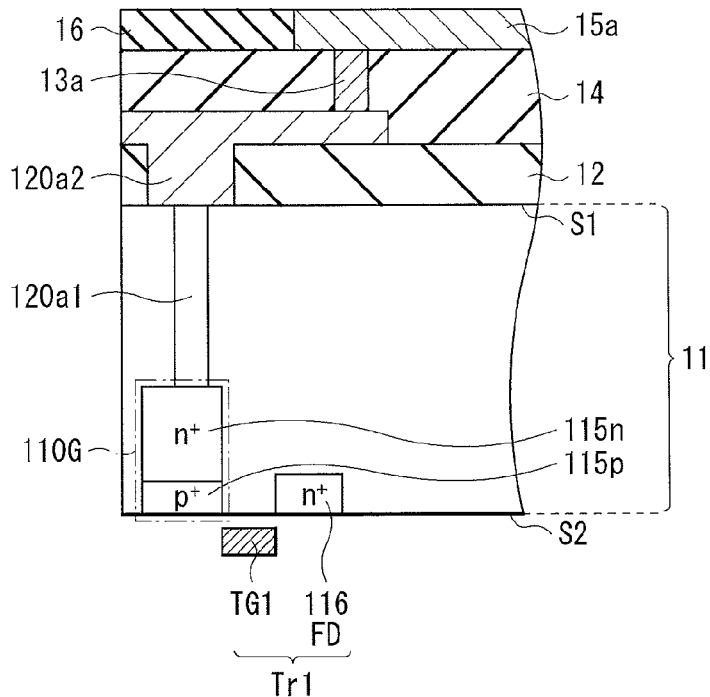
FIG. 3 is a cross-sectional view illustrating a configuration (lower-side electron extraction) of an electric charge (electron) accumulation layer in an organic photoelectric conversion section.

FIG. 3 illustrates a detailed configuration example of the green electric storage layer 110G. It is to be noted that, here, description will be provided of a case where, out of a pair of an electron and a hole generated by the organic photoelectric conversion section 11G, the electron is read as a signal electric charge from a lower electrode 15a side. Also, FIG. 3 shows the gate electrode TG1 of the transfer transistor Tr1 out of the pixel transistors.

The green electric storage layer 110G is configured to include an n-type region 115n that is to be an electron accumulation layer. Part of the n-type region 115n is connected to the electrically-conductive plug 120a1, and is configured to accumulate an electron transmitted from the lower electrode 15a side via the electrically-conductive plug 120a1. This n-type region 115n is also connected to the FD 116 (an n-type region) of the transfer transistor Tr1 for green. It is to be noted that a p-type region 115p (a hole accumulation layer) is formed near an interface of the n-type region 115n and the surface S2.

The electrically-conductive plugs 120a1 and 120b1, together with electrically-conductive plugs 120a2 and 120b2 which will be described later, serve as connectors between the organic photoelectric conversion section 11G and the semiconductor substrate 11, and serve as transmission paths for an electron or a hole generated in the organic photoelectric conversion section 11G. In the present embodiment, the electrically-conductive plug 120a1 is conducted to the lower electrode 15a in the organic photoelectric conversion section 11G, and is connected to green electric storage layer 110G. The electrically-conductive plug 120b1 is conducted to an upper electrode 18 in the organic photoelectric conversion section 11G, and serves as a wiring for discharging a hole.

Each of these electrically-conductive plugs 120a1 and 120b1 may be configured, for example, of an electrically-conductive-type semiconductor layer, and may be formed to be embedded in the semiconductor substrate 11. In this case, the electrically-conductive plug 120a1 may be favorably of an n-type (since the electrically-conductive plug 120a1 is to be a transmission path of an electron), and the electrically-conductive plug 120b1 may be favorably of a p-type (since the electrically-conductive plug 120b1 is to be a transmission path of a hole). Alternatively, the electrically-conductive plugs 120a1 and 120b1 may each be configured, for example, of an electrically-conductive film material such as tungsten embedded in a through via. In this case, for example, in order to suppress short circuit with silicon, a side face of the via may be desirably covered with an insulating film made of a material such as silicon oxide ($SiO_2$) and silicon nitride (SiN).

[Multi-Layered Wiring Layer 51]

The multi-layered wiring layer 51 is formed on the surface S2 of the semiconductor substrate 11 described above. In the multi-layered wiring layer 51, a plurality of wirings 51a are provided with an interlayer insulating film 52 in between. In such a manner, in the photoelectric conversion device 10, the multi-layered wiring layer 51 is formed on the opposite side from the light receiving surface. Therefore, a so-called back-illumination-type solid-state imaging unit is achievable. For example, a support substrate 53 made of silicon may be attached to this multi-layered wiring layer 51.

[Organic Photoelectric Conversion Section 11G]

The organic photoelectric conversion section 11G is an organic photoelectric conversion device that uses an organic semiconductor to absorb light having a selective wavelength range (here, green light) and to generate a pair of an electron and a hole. The organic photoelectric conversion section 11G has a configuration in which an organic photoelectric conversion layer 17 is sandwiched between the pair of electrodes (the lower electrode 15a and the upper electrode 18) for extracting a signal electric charge. The lower electrode 15a and the upper electrode 18 are electrically connected to the electrically-conductive plugs 120a1 and 120b1 embedded in the semiconductor substrate 11, via the wiring layer, the contact metal layer, etc. as will be described later. It is to be noted that the organic photoelectric conversion layer 17 in the present embodiment is a specific example of "organic semiconductor layer" in the present disclosure, and the upper electrode 18 is a specific example of "inorganic film" in the present disclosure.

Specifically, in the organic photoelectric conversion section 11G, interlayer insulating films 12 and 14 are formed on the surface S1 of the semiconductor substrate 11. In the insulating film 12, through holes are provided in regions opposing the respective electrically-conductive plugs 120a1 and 120b1. The electrically-conductive plugs 120a2 and 120b2 are embedded in the respective through holes. In the interlayer insulating film 14, wiring layers 13a and 13b are embedded in regions opposing the respective electrically-conductive plugs 120a2 and 120b2. On this interlayer insulating film 14, the lower electrode 15a is provided and a wiring layer 15b is provided. The wiring layer 15b is electrically separated from the lower electrode 15a by an insulating film 16. Out of these, on the lower electrode 15a, the organic photoelectric conversion layer 17 is formed. The upper electrode 18 is formed to cover the organic photoelectric conversion layer 17. Although the details will be described later, a protective film 19 is formed on the upper electrode 18 so as to cover a surface of the upper electrode 18. A contact hole H is provided in a predetermined region in the protective film 19. A contact metal layer 20 is formed on the protective film 19 so as to fill the contact hole H and to extend to a top face of the wiring layer 15b.

The electrically-conductive plug 120a2 serves as a connector together with the electrically-conductive plug 120a1 as described above. Also, the electrically-conductive plug 120a2 forms a transmission path of an electric charge (an electron) from the lower electrode 15a to the green electric storage layer 110G, together with the electrically-conductive plug 120a1 and the wiring layer 13a. The electrically-conductive plug 120b2 serves as a connector together with the electrically-conductive plug 120b1 as described above. Also, the electrically-conductive plug 120b2 forms a discharge path of an electric charge (a hole) from the upper electrode 18, together with the electrically-conductive plug 120b1, the wiring layer 13b, the wiring layer 15b, and the contact metal layer 20. In order to allow the electrically-conductive plugs 120a2 and 120b2 to serve as light blocking films, the electrically-conductive plugs 120a2 and 120b2 each may be desirably configured, for example, of a laminated film of metal materials such as titanium (Ti), titanium nitride (TiN), and tungsten. Also, it may be desirable to use such a laminated film since contact with silicon is allowed to be thereby secured even in a case where the electrically-conductive plugs 120a1 and 120b1 are each formed as an n-type or p-type semiconductor layer.

The interlayer insulating film 12 may be desirably configured of an insulating film that has low interface state in order to decrease interface state with the semiconductor substrate 11 (the silicon layer 110) and to suppress occurrence of a dark current from the interface with the silicon layer 110. As such an insulating film, for example, a laminated film of a hafnium-oxide ($HfO_2$) film and a silicon oxide ($SiO_2$) film may be used. The interlayer insulating film 14 may be configured, for example, of a single-layer film configured of one of silicon oxide, silicon nitride, silicon oxynitride (SiON), etc., or a laminated film configured of two or more thereof.

The insulating film 16 may be configured, for example, of a single-layer film configured of one of silicon oxide, silicon nitride, silicon oxynitride (SiON), etc., or a laminated film configured of two or more thereof. In the present embodiment, the insulating film 16 has a planarized surface, and has a shape and a pattern that has almost no level difference with the lower electrode 15a. This insulating film 16 has a function to electrically separate the lower electrodes 15a in the respective pixels when the photoelectric conversion devices 10 are used as pixels in a solid-state imaging unit.

The lower electrode 15a exactly opposes the light receiving surfaces of the inorganic photoelectric conversion sections 11B and 11R formed in the semiconductor substrate 11, and is provided in a region that covers light receiving surfaces thereof. This lower electrode 15a is configured of an electrically-conductive film that has light transmission characteristics, and may be configured, for example, of ITO (indium-tin oxide). However, as a configuration material of the lower electrode 15a, a tin-oxide ($SnO_2$)-based material added with a dopant, or a zinc-oxide-based material obtained by adding a dopant to aluminum-zinc oxide (ZnO) may be used other than the ITO. As the zinc-oxide-based material, for example, aluminum-zinc oxide (AZO) in which aluminum (Al) is added as a dopant, gallium-zinc oxide (GZO) in which gallium (Ga) is added, and indium-zinc oxide (IZO) in which indium (In) is added may be mentioned. Alternatively, other than these materials, CuI, $InSbO_4$, ZnMgO, $CuInO_2$, $MgIN_2O_4$, CdO, $ZnSnO_3$, etc. may be used. It is to be noted that, in the present embodiment, the signal electric charge (the electron) is extracted from the lower electrode 15a as described above. Therefore, this lower electrode 15a is formed separately for each pixel in a solid-state imaging unit that uses the photoelectric conversion device 10 as a pixel which will be described later.

The organic photoelectric conversion layer 17 is configured of an organic semiconductor that performs photoelectric conversion on light having a selective wavelength range, and on the other hand, transmits light having other wavelength range. The organic semiconductor may be desirably configured to include one or both of an organic p-type semiconductor and an organic n-type semiconductor. As such an organic semiconductor, one of quinacridone derivatives, naphthalene derivatives, anthracene derivatives, phenanthrene derivatives, tetracene derivatives, pyrene derivatives, perylene derivatives, and fluoranthene derivatives may be favorably used. Alternatively, a polymer such as phenylene vinylene, fluorene, carbazole, indole, pyrene, pyrrole, picoline, thiophene, acethylene, and diacethylene, or a derivative thereof may be used. In addition thereto, polycondensed aromatic series, polycondensed aromatic rings, and chain compounds in which heterocyclic compounds are condensed such as metal complex dyes, cyanine-based dyes, merocyanine-based dyes, phenylxanthene-based dyes, triphenylmethane-based dyes, rhodacyanine-based dyes, xanthene-based dyes, macrocyclic azaanulene-based dyes, azulene-based dyes, naphthoquinone, anthraquinone-based dyes, anthracene, and pyrene, two nitride-containing heterocyclic rings such as quinolone, benzothiazole, and benzoxazole that have a squarylium group and a chroconic methine group as bonding chains, cyanine-based-like dyes combined with a squarylium group and a chroconic methine group, etc. may be preferably used. It is to be noted that, as the above-described metal complex dye, a dithiol-metal-complex-based dye, a metal phthalocyanine dye, a metal porphyrin dye, or a ruthenium complex dye may be preferable. However, the metal complex dye is not limited thereto. In the present embodiment, the organic photoelectric conversion layer 17 may be capable of performing photoelectric conversion, for example, of green light corresponding to part or all of a wavelength range from 495 nm to 570 nm. Such an organic photoelectric conversion layer 17 may have a thickness, for example, from 50 nm to 500 nm.

Other layer which is not illustrated may be provided between this organic photoelectric conversion layer 17 and the lower electrode 15a and between this organic photoelectric conversion layer 17 and the upper electrode 18. For example, an underlying film, an electron blocking film, the organic photoelectric conversion layer 17, a hole blocking film, a buffer film, and a work function adjustment film may be laminated in order from the lower electrode 15a side.

The upper electrode 18 is configured of an electrically-conductive film that has light transmission characteristics similar to those of the lower electrode 15a. In the present embodiment, the hole extracted from the upper electrode 18 is discharged as described above. Therefore, in the solid-state imaging unit that uses the photoelectric conversion device 10 as a pixel, this upper electrode 18 may be separated for each pixel, or this upper electrode 18 may be formed as an electrode common to the respective pixels. The upper electrode 18 may have a thickness, for example, from 10 nm to 200 nm.

The protective film 19 is configured of a material that has light transmission characteristics, and may be a single-layer film configured of one of silicon oxide, silicon nitride, silicon oxynitride, etc., or a laminated film configured of two or more thereof. This protective film 19 may have a thickness, for example, from 100 nm to 30000 nm.

The contact metal layer 20 may be configured, for example, of one of titanium, tungsten, titanium nitride, aluminum, etc., or a laminated film configured of two or more thereof.

[Relationship Between Positions of Organic Photoelectric Conversion Layer 17, Upper Electrode 18, and Protective Film 19]

Figure 4:
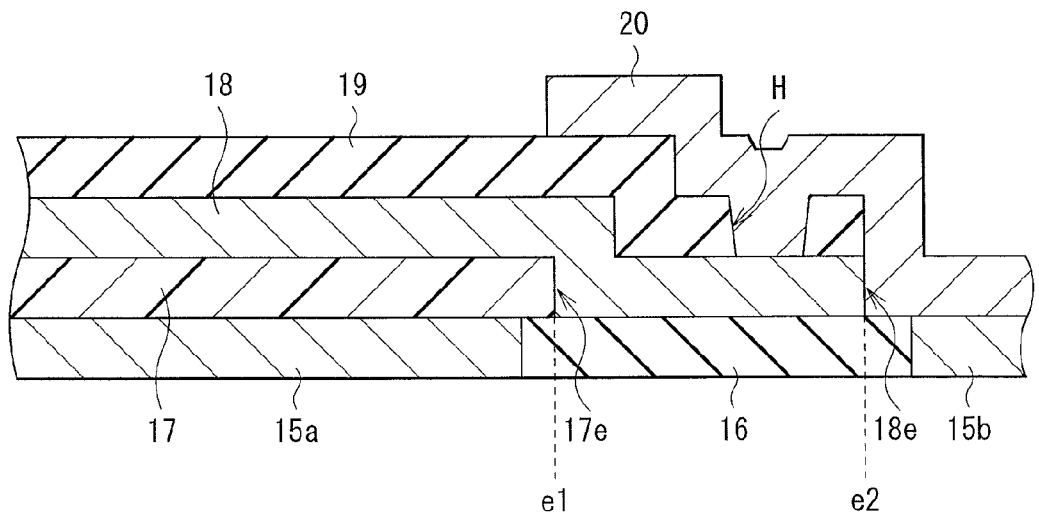
FIG. 4 is a cross-sectional view showing a main part configuration around the organic photoelectric conversion section in an enlarged manner.
Figure 5:
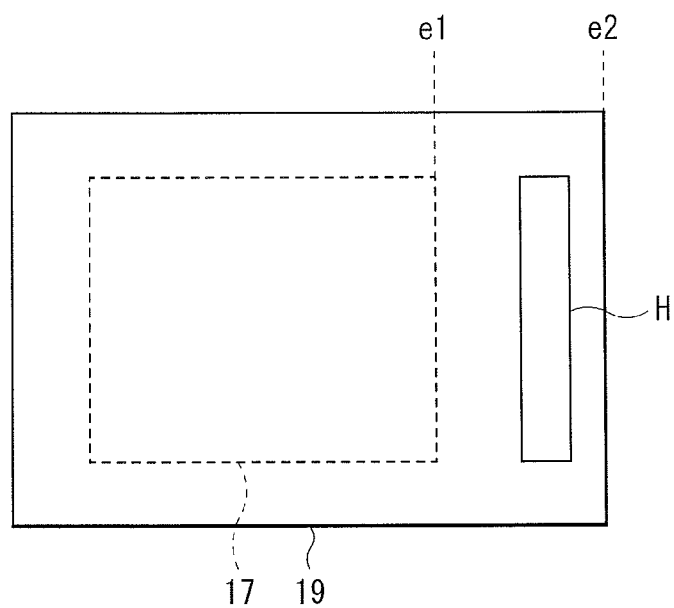
FIG. 5 is a planar view illustrating a relationship between formation positions of an organic photoelectric conversion layer, a protective film (an upper electrode), and a contact hole.

In the present embodiment, in the organic photoelectric conversion section 11G as described above, the upper electrode 18 and the protective film 19 are provided so as to cover the organic photoelectric conversion layer 17. FIG. 4 illustrates enlarged part of the above-described organic photoelectric conversion section 11G. FIG. 5 illustrates a planar configuration of the organic photoelectric conversion layer 17, the protective film 19 (the upper electrode 18), and the contact hole H.

Specifically, a peripheral edge portion e2 of the protective film 19 (the same is applicable to the upper electrode 18) is located on an outer side compared to a peripheral edge portion e1 of the organic photoelectric conversion layer 17. The protective film 19 and the upper electrode 18 are formed to be extended to the outer side compared to the organic photoelectric conversion layer 17. In detail, the upper electrode 18 is formed so as to cover a top face and side faces of the organic photoelectric conversion layer 17, and to extend onto the insulating film 16. The protective film 19 covers a top face of such an upper electrode 18, and is formed in a planar shape similar to that of the upper electrode 18. The contact hole H is provided in a region (an outer region compared to the peripheral edge portion e1), in the protective film 19, that does not oppose the organic photoelectric conversion layer 17. The contact hole H allows part of the surface of the upper electrode 18 to be exposed. A distance between the peripheral edge portions e1 and e2 is not particularly limited, but may be, for example, 1 μm to 500 μm. It is to be noted that, in FIG. 4, one rectangular contact hole H is provided along an edge side of the organic photoelectric conversion layer 17. However, a shape, the number, etc. of the contact hole H are not limited thereto. The contact hole H may have other shape (such as a circular shape and a square shape), and a plurality of contact holes H may be provided.

In the organic photoelectric conversion section 11G, a planarization film 21 is formed so as to cover an entire surface of the protective film 19 and the contact metal layer 20. An on-chip lens 22 (a micro lens) is provided on the planarization film 21. The on-chip lens 22 condenses light that enters the on-chip lens 22 from the above to the respective light receiving surfaces of the organic photoelectric conversion layer 11G and the inorganic photoelectric conversion layers 11B and 11R. In the present embodiment, the multi-layered wiring layer 51 is formed on the surface S2 side of the semiconductor substrate 11. Therefore, the respective light receiving surfaces of the organic photoelectric conversion layer 11G and the inorganic photoelectric conversion layers 11B and 11R are allowed to be arranged close to one another. Therefore, it is possible to reduce variations in sensitivity between colors resulting depending on the F-number of the on-chip lens 22.

It is to be noted that, in the photoelectric conversion device 10 in the present embodiment, the signal electric charge (the electron) is extracted from the lower electrode 15a. Therefore, in the solid-state imaging unit that uses the photoelectric conversion device 10 as a pixel, the upper electrode 18 may be a common electrode as described above. In this case, it is enough that the above-described transmission path configured of the contact hole H, the contact metal layer 20, the wiring layers 15b and 13b, and the electrically-conductive plugs 120b1 and 120b2 be formed at least in one place for all pixels.

[Manufacturing Method]

The photoelectric conversion device 10 as described above may be manufactured as follows, for example. FIG. 6 to FIG. 20 illustrate a method of manufacturing the photoelectric conversion device 10 in order of steps. It is to be noted that FIG. 13 to FIG. 20 only illustrate a main part configuration of the photoelectric conversion device 10.

Figure 6A:
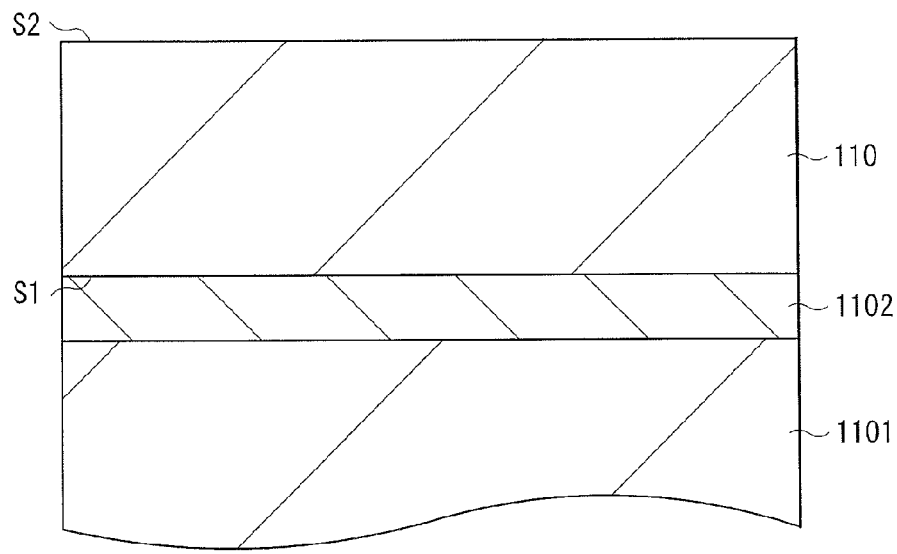
FIG. 6A is a cross-sectional view for explaining a method of manufacturing the photoelectric conversion device shown in FIG. 1.
Figure 7:
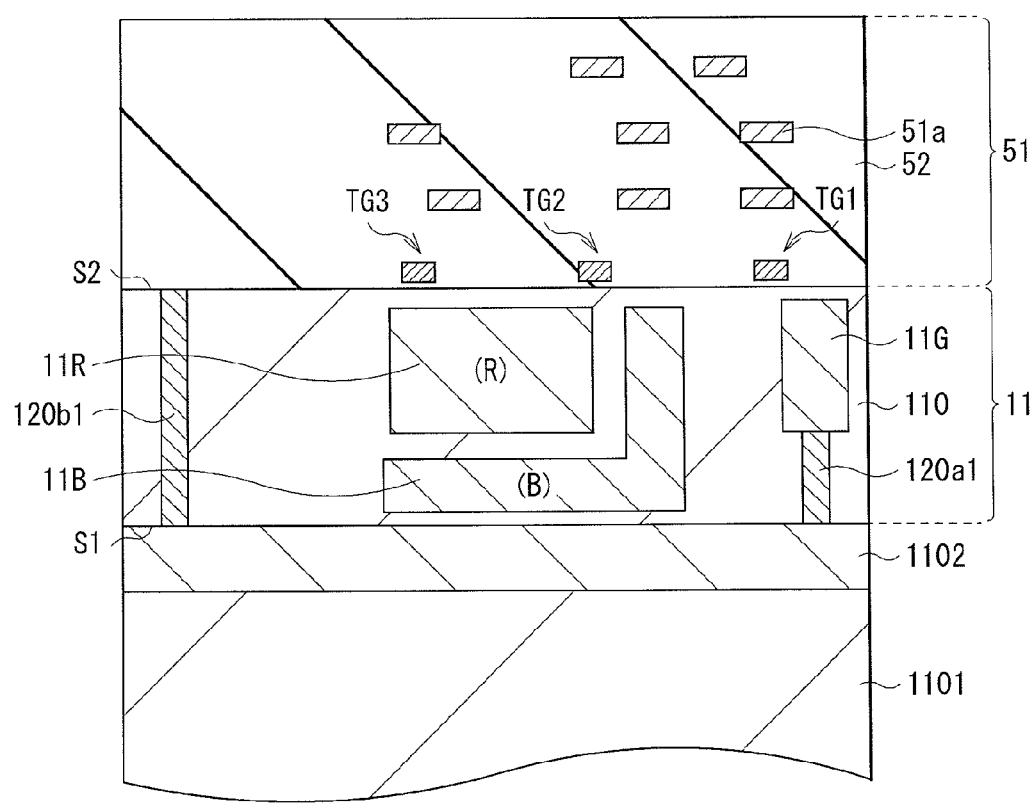
FIG. 7 is a cross-sectional view illustrating a process following FIG. 6B.
Figure 8:
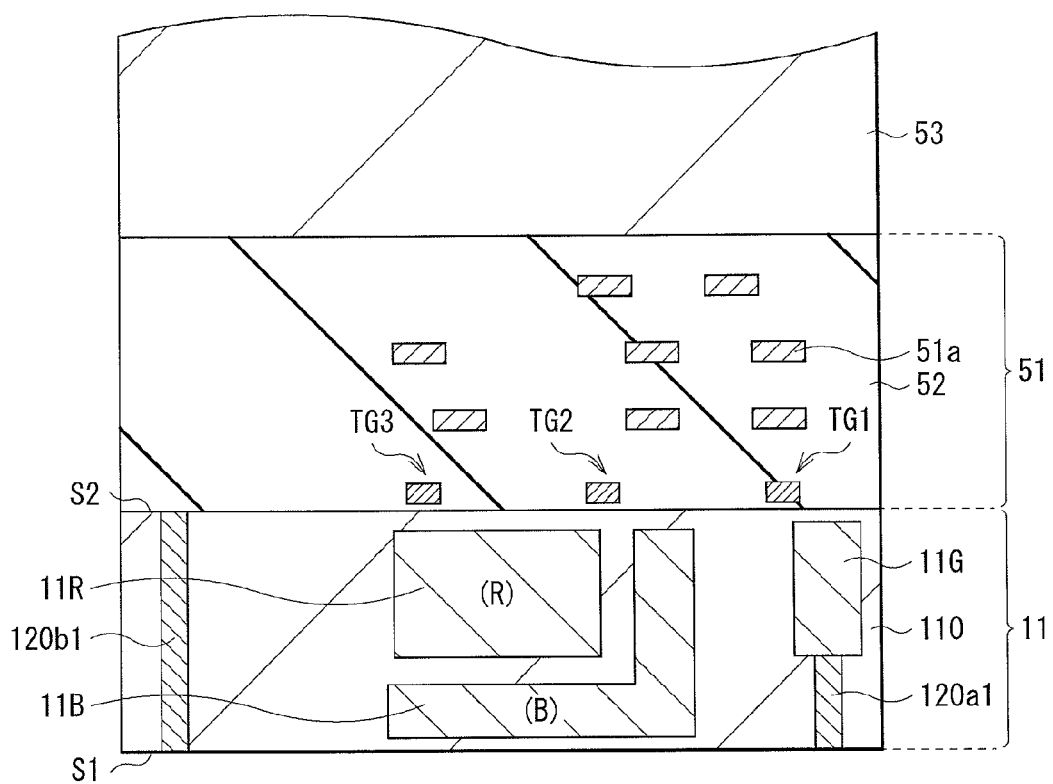
FIG. 8 is a cross-sectional view illustrating a process following FIG. 7.

First, the semiconductor substrate 11 is formed. Specifically, as shown in FIG. 6A, a so-called SOI substrate is prepared in which the silicon layer 110 is formed on a silicon base 1101 with a silicon oxide film 1102 in between. It is to be noted that a surface, of the silicon layer 110, on the silicon oxide film 1102 side becomes the back face (the surface S1) of the semiconductor substrate 11. FIG. 6 to FIG. 8 illustrate states that are vertically reversed from the structure shown in FIG. 1.

Figure 6B:
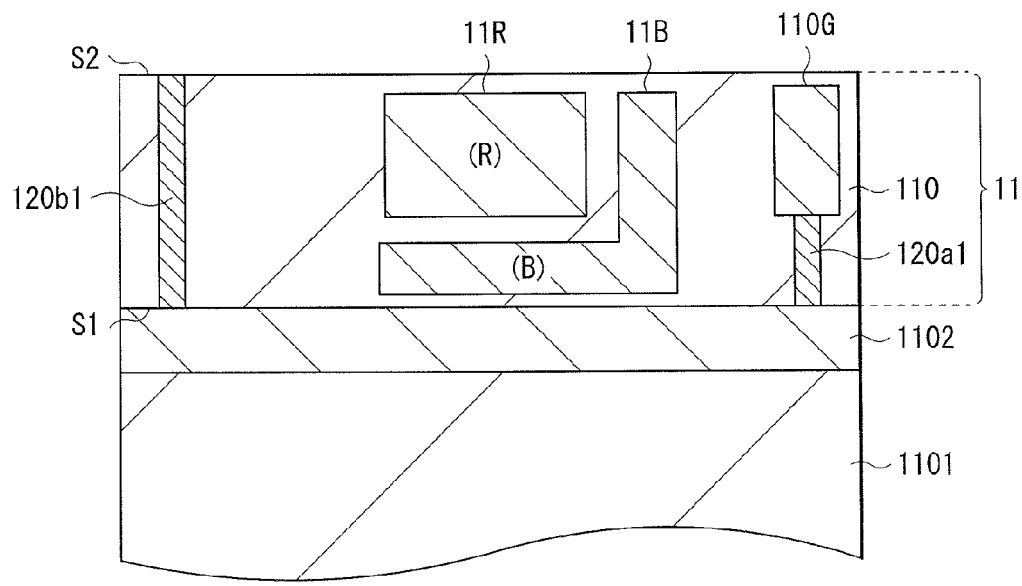
FIG. 6B is a cross-sectional view illustrating a process following FIG. 6A.

Subsequently, as shown in FIG. 6B, the electrically-conductive plugs 120a1 and 120b1 are formed in the silicon layer 110. At this time, the electrically-conductive plugs 120a1 and 120b1 may be formed, for example, by forming through vias in the silicon layer 110, and then filling inside of these through vias with barrier metal such as silicon nitride and with tungsten as described above. Alternatively, an electrically-conductive-type impurity semiconductor layer may be formed, for example, by ion injection to the silicon layer 110. In this case, the electrically-conductive plug 120a1 is formed as an n-type semiconductor layer, and the electrically-conductive plug 120b1 is formed as a p-type semiconductor layer. Thereafter, for example, the inorganic photoelectric conversion sections 11B and 11R that have the p-type region and the n-type region, respectively, as shown in FIG. 2 may be formed by ion injection in regions having different depths in the silicon layer 110 (so as to overlap each other). Further, the green electric storage layer 110G is formed by ion injection in a region adjacent to the electrically-conductive plug 120a1. Thus, the semiconductor substrate 11 is formed.

It is to be noted that, subsequently, the pixel transistors including the transfer transistors Tr1 to Tr3 and the peripheral circuits such as the logic circuit are formed on the surface S2 side of the semiconductor substrate 11, which are not illustrated.

Subsequently, as shown in FIG. 7, a plurality of layers of wirings 51a are formed on the surface S2 of the semiconductor substrate 11 with the interlayer insulating film 52 in between. Thus, the multi-layered wiring layer 51 is formed.

Subsequently, as shown in FIG. 8, the support substrate 53 made of silicon is attached onto the multi-layered wiring layer 51. Thereafter, the silicon base 1101 and the silicon oxide film 1102 are peeled off from the surface S1 side of the semiconductor substrate 11, and thereby, the surface 51 of the semiconductor substrate 11 is exposed.

Figure 9:
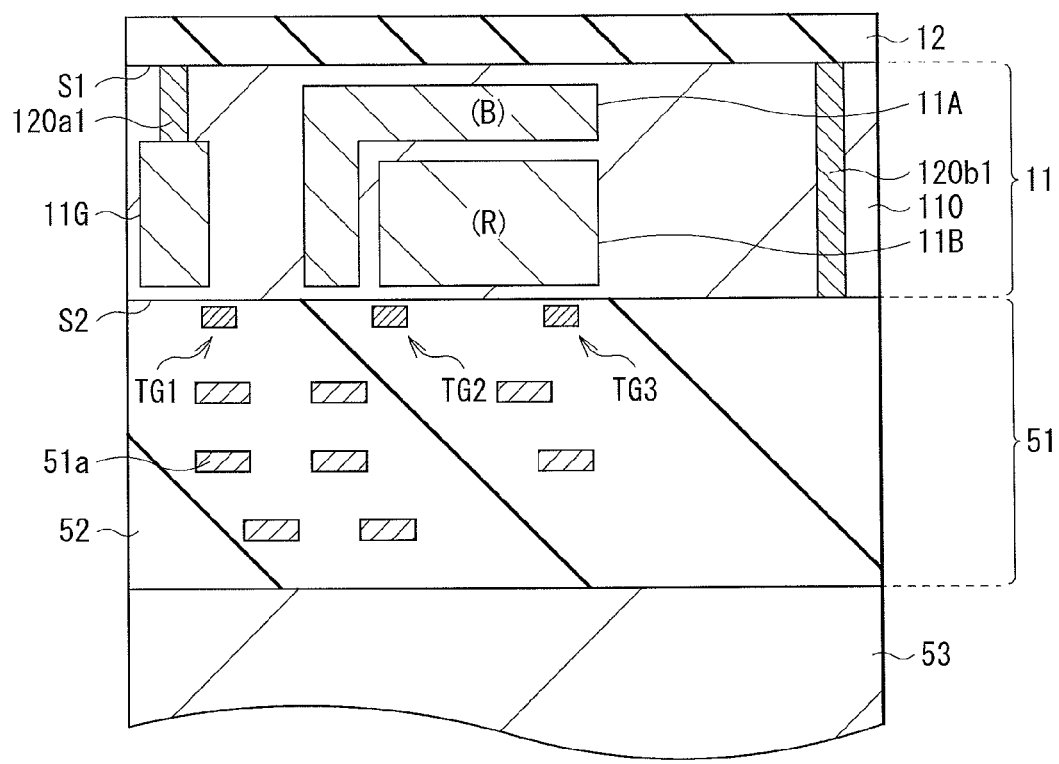
FIG. 9 is a cross-sectional view illustrating a process following FIG. 8.

Next, the organic photoelectric conversion section 11G is formed on the surface S1 of the semiconductor substrate 11. Specifically, first, as shown in FIG. 9, the interlayer insulating film 12 configured of a laminated film of a hafnium oxide film and a silicon oxide film as described above is formed on the surface S1 of the semiconductor substrate 11. For example, the hafnium oxide film may be formed by an ALD (Atomic Layer Deposition) method, and then, for example, the silicon oxide film may be formed by a plasma CVD (Chemical Vapor Deposition) method.

Figure 10:
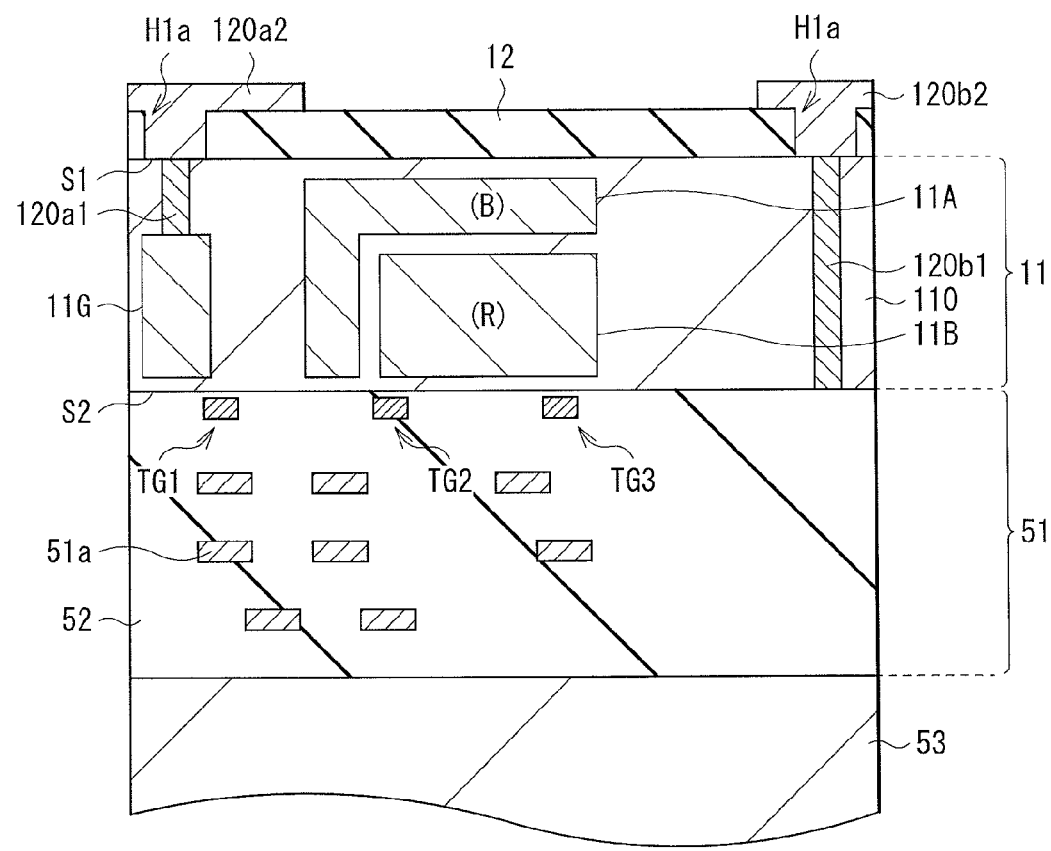
FIG. 10 is a cross-sectional view illustrating a process following FIG. 9.

Subsequently, as shown in FIG. 10, contact holes H1a and H1b are formed in positions, in the interlayer insulating film 12, that oppose the electrically-conductive plugs 120a1 and 120b1. The electrically-conductive plugs 120a2 and 120b2 made of the above-described material are formed so as to fill these contact holes H1a and H1b, respectively. At this time, the electrically-conductive plugs 120a2 and 120b2 may be formed to extend to regions which may be favorably shielded from light (so as to cover the regions which may be favorably shielded from light). Alternatively, a light blocking layer may be formed in a region separated from the electrically-conductive plugs 120a2 and 120b2.

Figure 11:
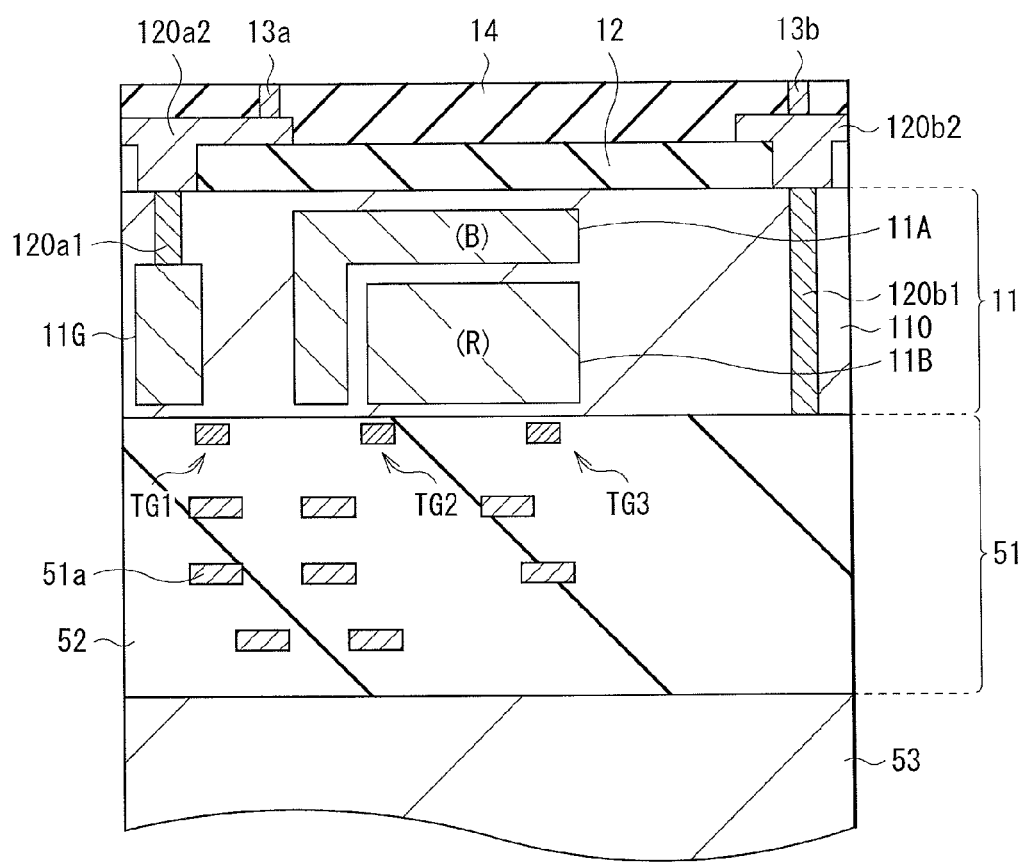
FIG. 11 is a cross-sectional view illustrating a process following FIG. 10.

Subsequently, as shown in FIG. 11, the interlayer insulating film 14 made of the above-described material may be formed, for example, by a plasma CVD method. It is to be noted that, after forming the film, a surface of the interlayer insulating film 14 may be desirably planarized, for example, by a CMP (Chemical Mechanical Polishing) method. Subsequently, contact holes are opened in positions, in the interlayer insulating film 14, that oppose the respective electrically-conductive plugs 120a2 and 120b2, and the respective contact holes are filled with the above-described material. Thus, the wiring layers 13a and 13b are formed. It is to be noted that, thereafter, the extra wiring-layer material (such as tungsten) on the interlayer insulating film 14 may be desirably removed, for example, by a CMP method, etc.

Figure 12:
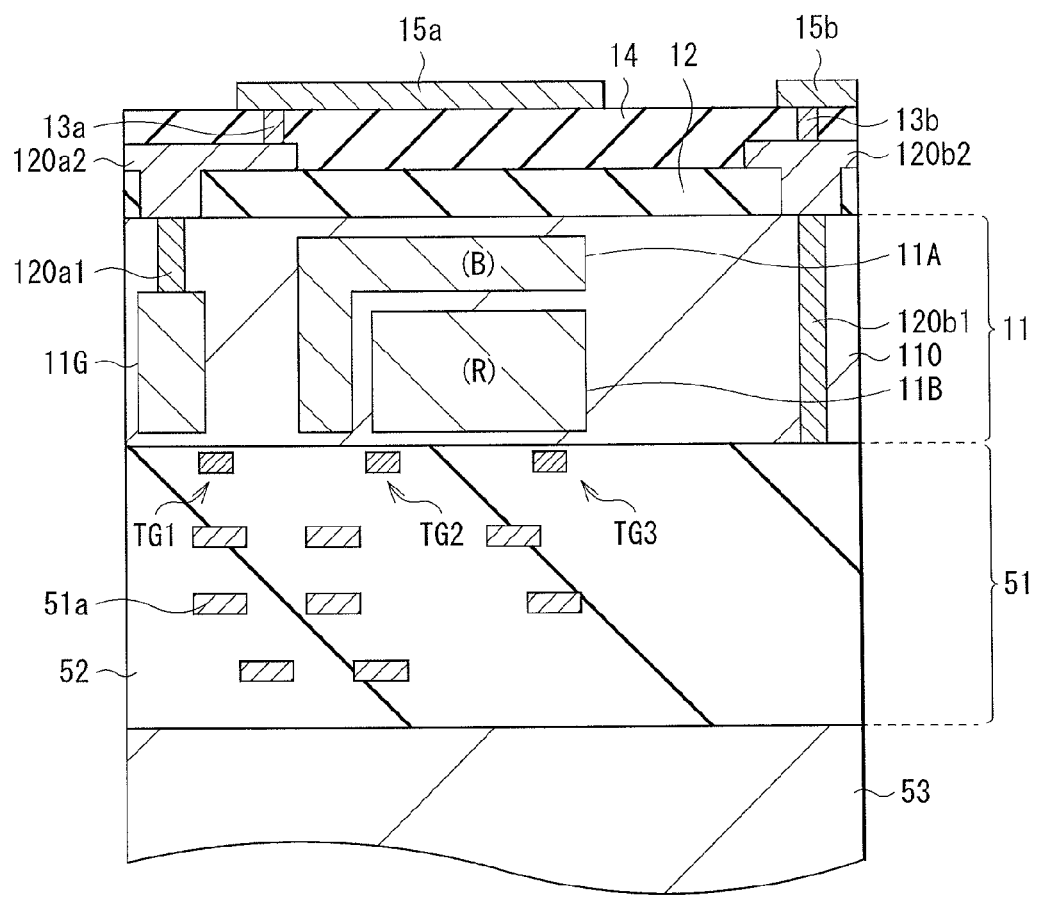
FIG. 12 is a cross-sectional view illustrating a process following FIG. 11.

Subsequently, as shown in FIG. 12, the lower electrode 15a is formed on the interlayer insulating film 14. Specifically, first, the above-described transparent electrically-conductive film may be formed on the entire surface on the interlayer insulating film 14, for example, by a sputtering method. Thereafter, a photolithography method is used (exposure, development, post-bake, etc. of a photoresist film is performed), and a selective part may be removed, for example, by dry etching or wet etching. Thus, the lower electrode 15a is formed. At this time, the lower electrode 15a is formed in a region that opposes the wiring layer 13a. Further, at the time of processing the transparent electrically-conductive film, the transparent electrically-conductive film is left also in a region that opposes the wiring layer 13b. Thus, the wiring layer 15b that configures part of the transmission path of the hole is formed together with the lower electrode 15a.

Figure 13A:
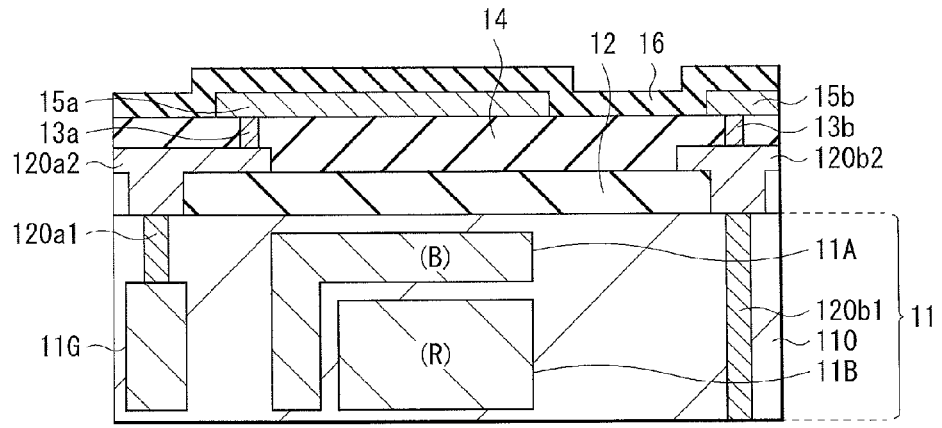
FIG. 13A is a cross-sectional view illustrating a process following FIG. 12.
Figure 13B:
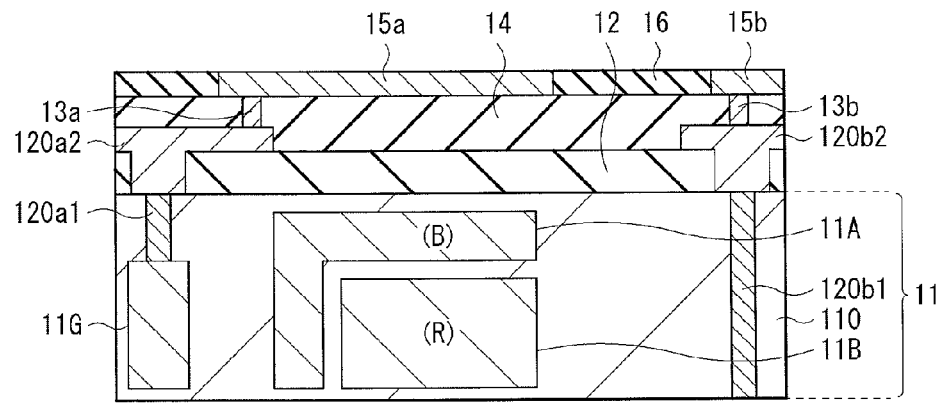
FIG. 13B is a cross-sectional view illustrating a process following FIG. 13A.

Subsequently, the insulating film 16 is formed. At this time, first, as shown in FIG. 13A, the insulating film 16 made of the above-described material may be formed, for example, by a plasma CVD method on the entire surface on the semiconductor substrate 11 so as to cover the interlayer insulating film 14, the lower electrode 15a, and the wiring layer 15b. Thereafter, as shown in FIG. 13B, the formed insulating film 16 may be polished, for example, by a CMP method. Thus, the lower electrode 15a and the wiring layer 15b are exposed from the insulating film 16, and a level difference between the lower electrode 15a and the insulating film 16 are moderated (may be desirably planarized).

Figure 14:
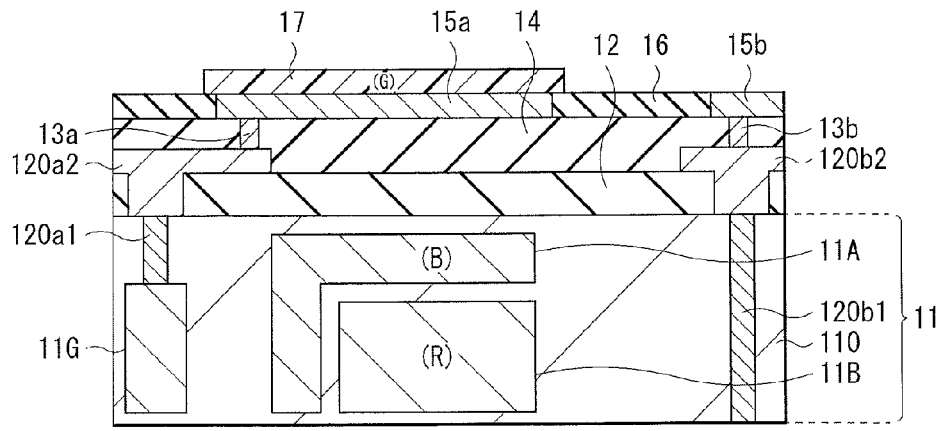
FIG. 14 is a cross-sectional view illustrating a process following FIG. 13B.

Next, as shown in FIG. 14, the organic photoelectric conversion layer 17 is formed on the lower electrode 15a. At this time, the photoelectric conversion material configured of the above-described material may be formed into a pattern, for example, by a vacuum deposition method using a metal mask. It is to be noted that, as described above, when other organic layer (such as the electron blocking layer) is formed in an upper or lower layer of the organic photoelectric conversion layer 17, the respective layers may be desirably formed in series (by a vacuum consistent process) in a vacuum step with the use of the same metal mask. Also, the method of forming the organic photoelectric conversion layer 17 is not necessarily limited to the method using the metal mask as described above, and other method such as a printing technique may be used.

[Forming and Processing of Upper Electrode 18]

Figure 15:
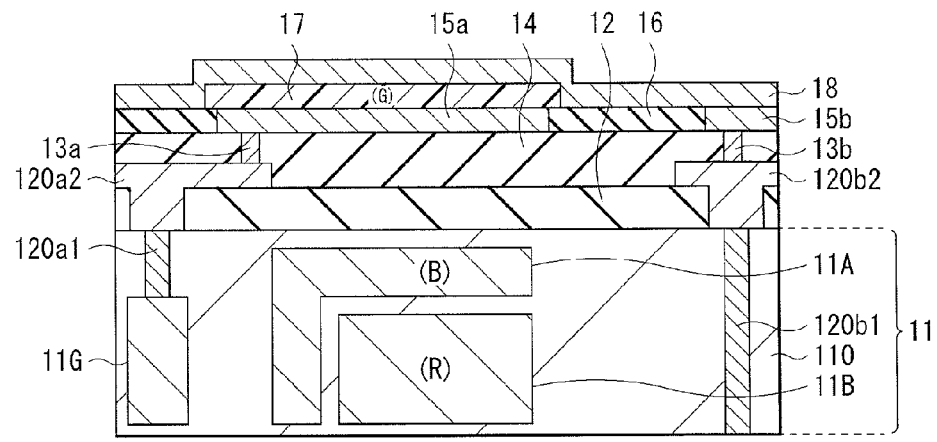
FIG. 15 is a cross-sectional view illustrating a process following FIG. 14.
Figure 16:
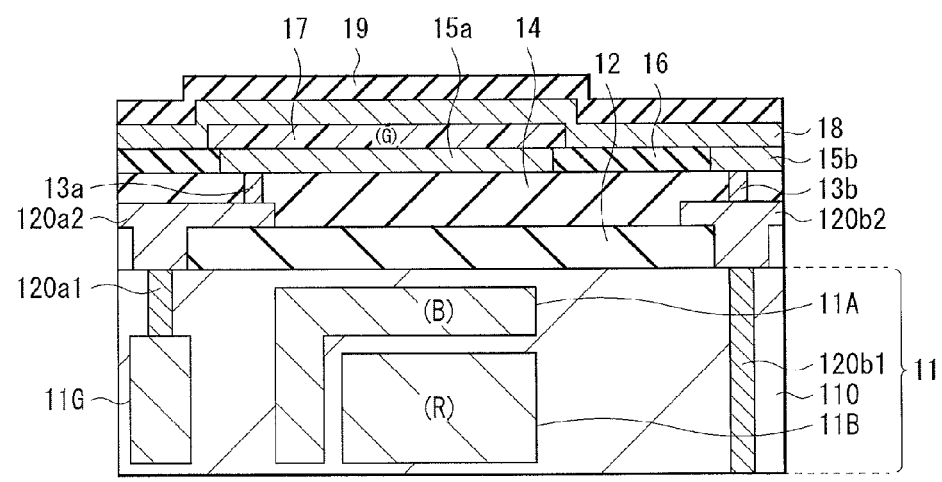
FIG. 16 is a cross-sectional view illustrating a process following FIG. 15.

Subsequently, the upper electrode 18 is formed. First, as shown in FIG. 15, the upper electrode 18 configured of the above-described transparent electrically-conductive film may be formed, for example, by a vacuum deposition method or a sputtering method over the entire substrate surface so as to cover the top face and the side faces of the organic photoelectric conversion layer 17. It is to be noted that the organic photoelectric conversion layer 17 has properties that may easily vary under influence of moisture, oxygen, hydrogen, etc. Therefore, the upper electrode 18 may be desirably formed with the organic photoelectric conversion layer 17 by a vacuum consistent process. Thereafter, (before patterning the upper electrode 18), as shown in FIG. 16, the protective film 19 made of the above-described material may be formed, for example, by a plasma CVD method so as to cover the top face of the upper electrode 18.

Figure 17A:
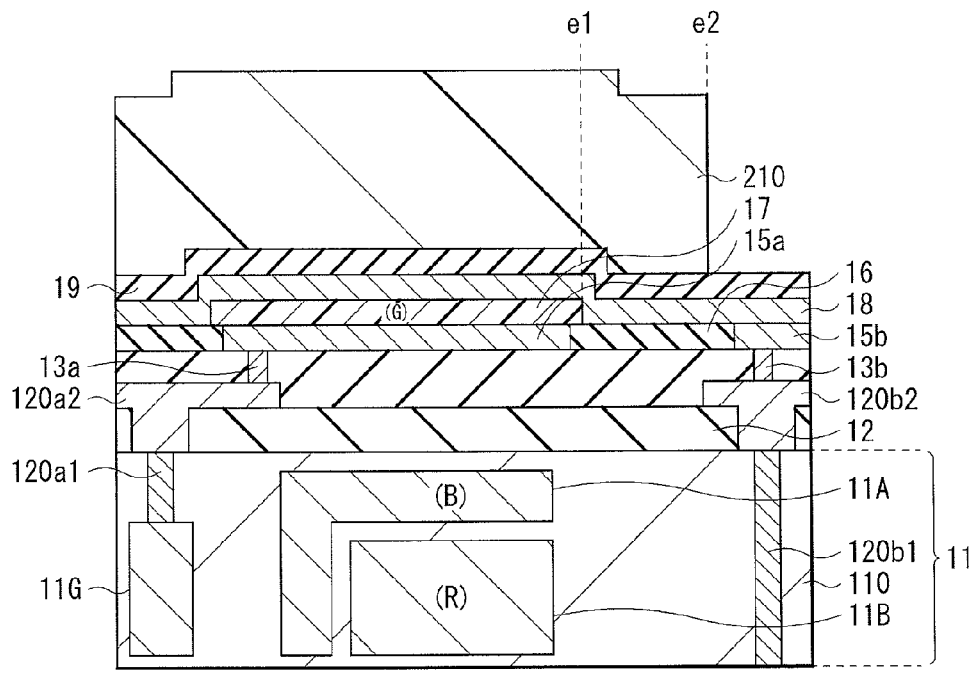
FIG. 17A is a cross-sectional view illustrating a process following FIG. 16.

Subsequently, after forming the protective film 19 on the upper electrode 18, the upper electrode 18 is processed. At this time, in the present embodiment, selective part of the upper electrode 18 and the protective film 19 is collectively removed by etching using a photolithography method. Specifically, first, as shown in FIG. 17A, a photoresist 210 is formed on the protective film 19, which is patterned into a predetermined shape. At this time, patterning is performed so that the peripheral edge portion (e2) of the photoresist 210 be located on the outer side compared to the peripheral edge portion e1 of the organic photoelectric conversion layer 17.

Figure 17B:
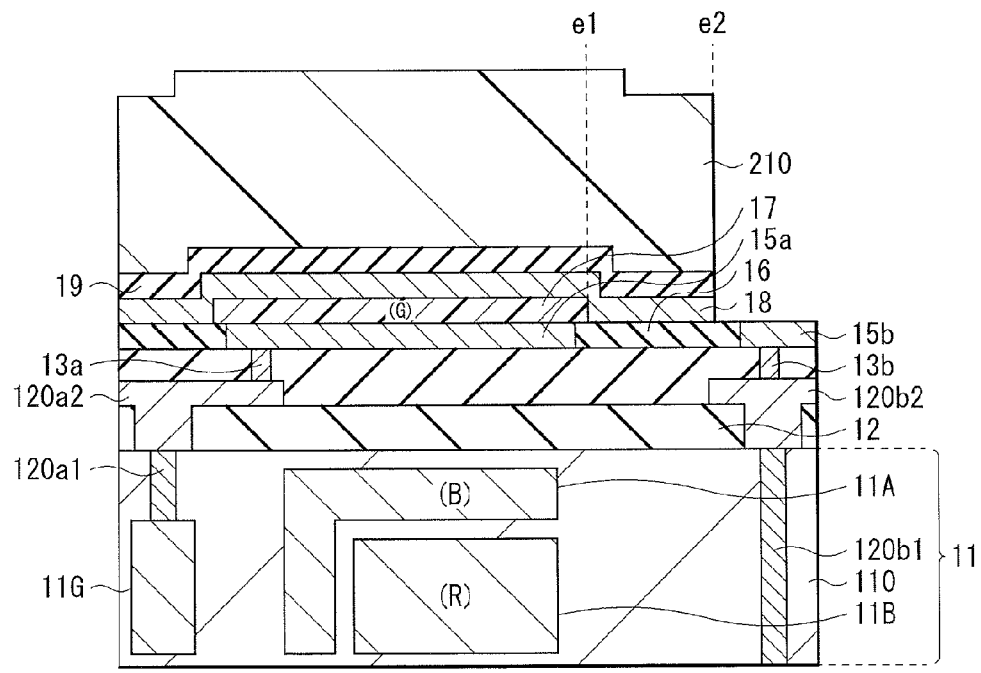
FIG. 17B is a cross-sectional view illustrating a process following FIG. 17A.

Subsequently, as shown in FIG. 17B, part of the protective film 19 and the upper electrode 18 may be collectively removed, for example, by dry etching.

Figure 18:
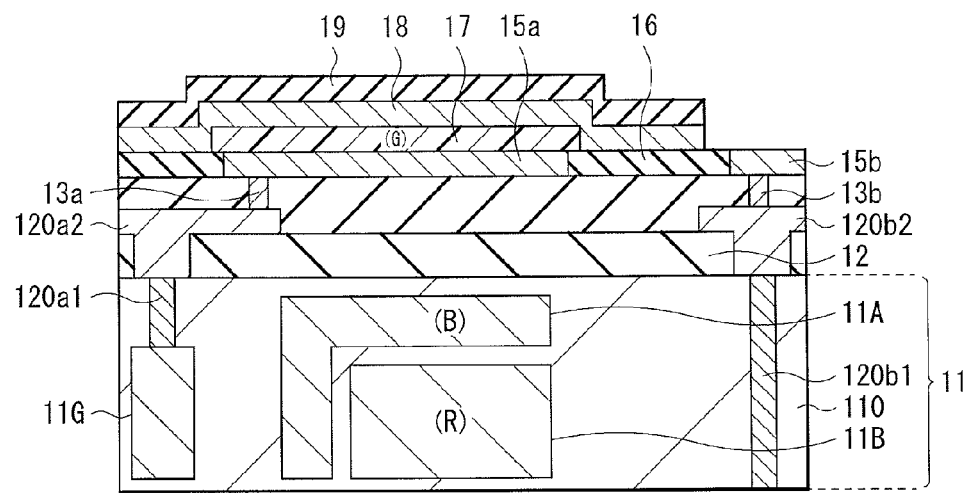
FIG. 18 is a cross-sectional view illustrating a process following FIG. 17B.

Subsequently, as shown in FIG. 18, the photoresist 210 is peeled off from the protective film 19 by ashing. Thereafter, post-processing such as washing is performed to remove a residual material. At the time of washing, for example, chemical solution such as ammonium-fluoride-based organic chemical solution, amine-based organic chemical solution, concentrated-sulfuric-acid-based chemical solution, and concentrated-nitric-acid-based chemical solution is used. When such chemical solution enters the organic film such as the organic photoelectric conversion layer 17, the organic film may be damaged or the film itself may be lost. In the present embodiment, as described above, the protective film 19 is formed before processing the upper electrode 18, and thereafter, the upper electrode 18 and the protective film 19 are processed in an outer region compared to the peripheral edge portion e1 of the organic photoelectric conversion layer 17. Therefore, the organic photoelectric conversion layer 17 is not exposed in the process (in particular, in the washing step) of processing the upper electrode 18. Even when a pin hole (a defect) is caused in the upper electrode 18, the protective film 19 prevents the chemical solution from entering. Therefore, it is possible to suppress damage in the organic photoelectric conversion layer 17.

Figure 19:
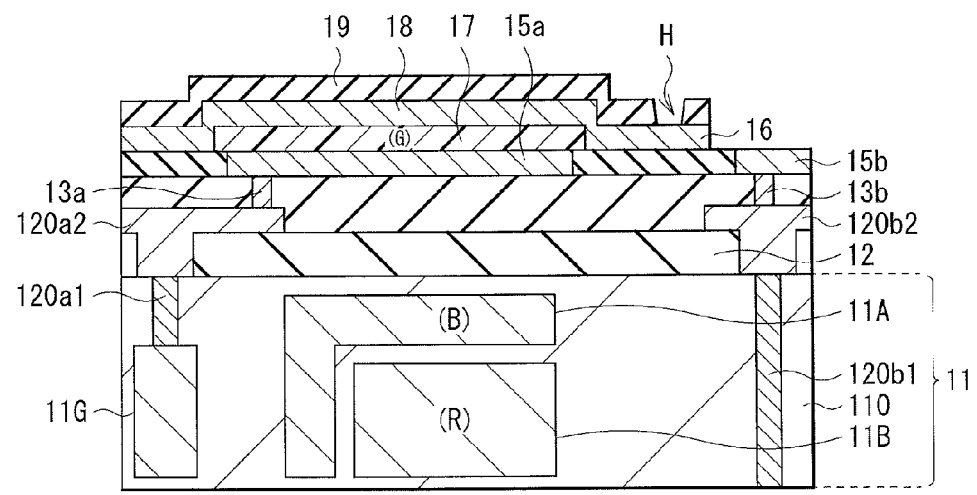
FIG. 19 is a cross-sectional view illustrating a process following FIG. 18.

Next, as shown in FIG. 19, the contact hole H may be formed in the protective film 19, for example, by etching using a photolithography method. At this time, the contact hole H may be desirably formed in a region not opposing the organic photoelectric conversion layer 17. Also after forming this contact hole H, a photoresist is peeled off and washing using chemical solution is performed in a manner similar to that described above. Therefore, the upper electrode 18 is exposed from the protective film 19 in a region opposing the contact hole H. Therefore, taking into consideration the occurrence of a pin hole as described above, the contact hole H may be desirably provided avoiding a formation region of the organic photoelectric conversion layer 17.

Figure 20:
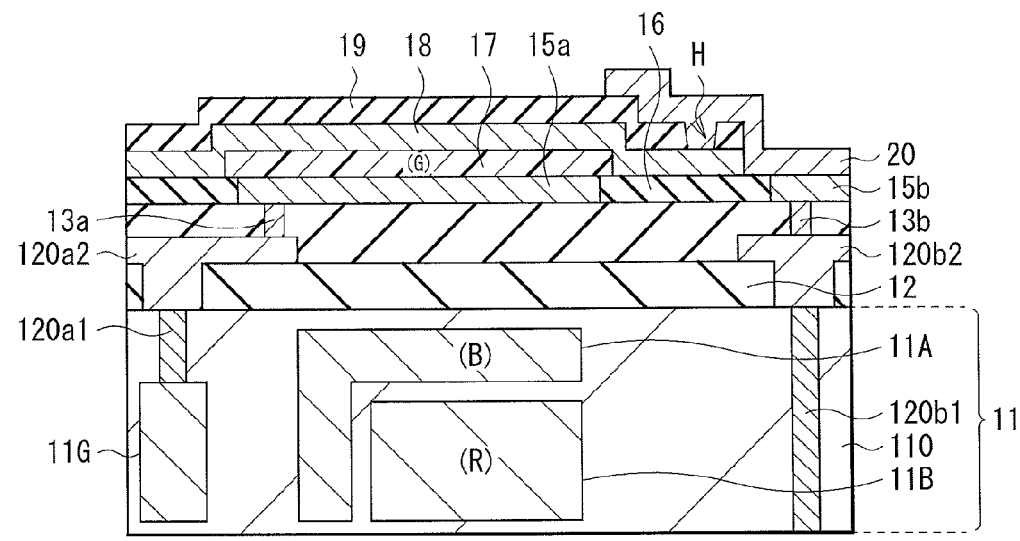
FIG. 20 is a cross-sectional view illustrating a process following FIG. 19.

Subsequently, as shown in FIG. 20, the contact metal layer 20 made of the above-described material may be formed, for example, by a sputtering method, etc. At this time, the contact metal layer 20 is formed on the protective film 19 so as to fill the contact hole H and to extend to the top face of the wiring layer 15b.

Finally, the planarization film 21 is formed over the entire surface on the semiconductor substrate 11, and then, the on-chip lens 22 is formed on this planarization film 21, which is not illustrated. Thus, the photoelectric conversion device 10 shown in FIG. 1 is completed.

[Functions and Effects]

Figure 21:
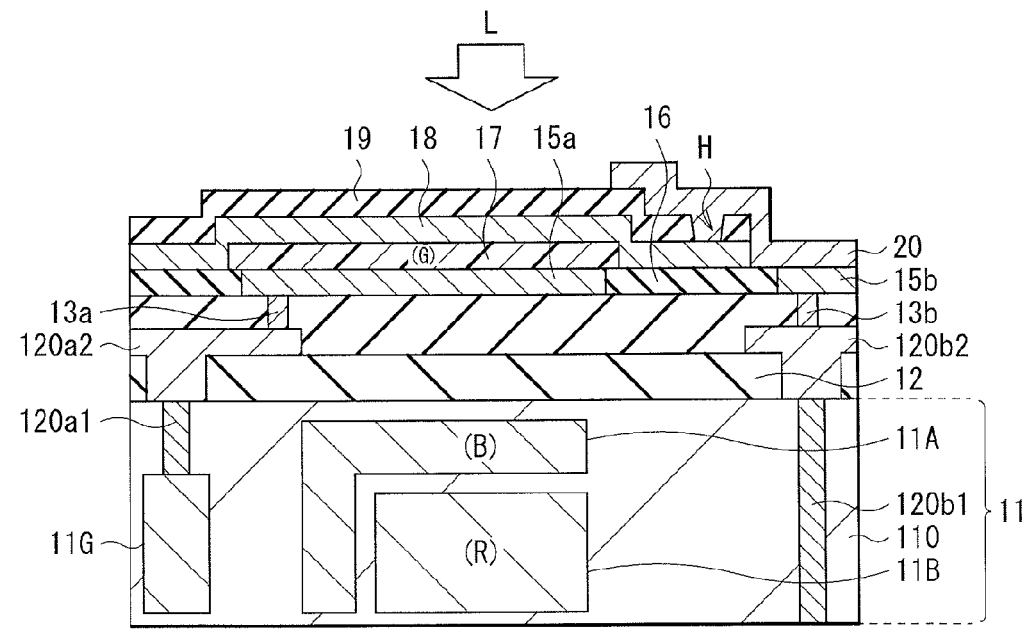
FIG. 21 is a main-part cross-sectional view explaining a function of the photoelectric conversion device shown in FIG. 1.
Figure 22:
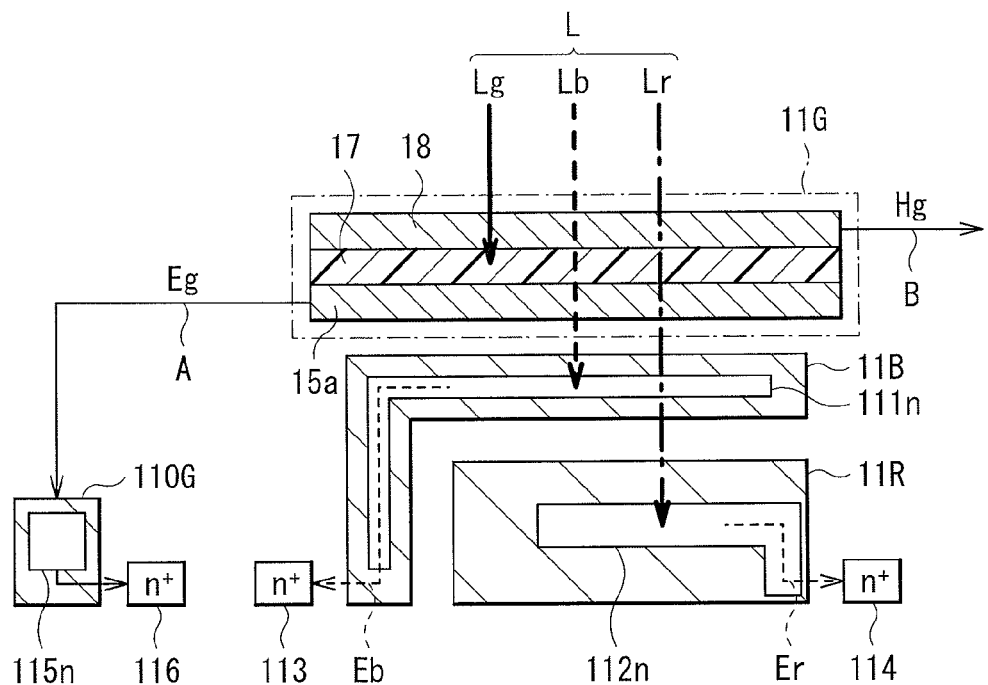
FIG. 22 is a schematic diagram for explaining the function of the photoelectric conversion device shown in FIG. 1.

In the photoelectric conversion device 10 as described above, for example, as a pixel in a solid-state imaging unit, a signal electric charge may be obtained as follows. Specifically, as shown in FIG. 21, when light L enters the photoelectric conversion device 10 via the on-chip lens 22 (which is not illustrated in FIG. 21), the light L passes through the organic photoelectric conversion section 11G, the inorganic photoelectric conversion sections 11B and 11R in order. In such a passing-through process, photoelectric conversion is performed on respective color lights of red, green, and blue. FIG. 22 schematically shows a process of obtaining a signal electric charge (an electron) based on incident light. Description will be provided below of a specific signal obtaining operation in each photoelectric conversion section.

[Obtaining of Green Signal by Organic Photoelectric Conversion Section 11G]

First, green light Lg out of the light L that has entered the photoelectric conversion device 10 is selectively detected (absorbed) in the organic photoelectric conversion section 11G, and is subjected to photoelectric conversion. Accordingly, an electron Eg out of a generated pair of an electron and a hole is extracted from the lower electrode 15a side, and then, is accumulated in the green electric storage layer 110G via a transmission path A (the wiring layer 13a and the electrically-conductive plugs 120a1 and 120a2). The accumulated electron Eg is transferred to the FD 116 at the time of reading operation. It is to be noted that a hole Hg is discharged from the upper electrode 18 side via a transmission path B (the contact metal layer 20, the wiring layers 13b and 15b, and the electrically-conductive plugs 120b1 and 120b2).

Specifically, the signal electric charge is accumulated as follows. That is, in the present embodiment, for example, a predetermined negative electric potential VL (<0 V) may be applied to the lower electrode 15a, and an electric potential VU (<VL) lower than the electric potential VL may be applied to the upper electrode 18. It is to be noted that the electric potential VL may be supplied, for example, from the wiring 51a in the multi-layered wiring layer 51 to the lower electrode 15a via the transmission path A. The electric potential VL may be supplied, for example, from the wiring 51a in the multi-layered wiring layer 51 to the upper electrode 18 via the transmission path B. Accordingly, in an electric-charge accumulation state (in a state where the unillustrated reset transistor and transfer transistor Tr1 are OFF), an electron out of the pair of an electron and a hole generated in the organic photoelectric conversion layer 17 is guided to the lower electrode 15a side that has a relatively-high electric potential (the hole is guided to the upper electrode 18 side). In such a manner, the electron Eg is extracted from the lower electrode 15a, and is accumulated in the green electric storage layer 110G (in detail, the n-type region 115n) via the transmission path A. Further, due to this accumulation of the electron Eg, the electric potential VL of the lower electrode 15a that is electrically conducted to the green electric storage layer 110G also varies. A variation amount of this electric potential VL corresponds to a signal electric potential (here, an electric potential of the green signal).

At the time of the reading operation, the transfer transistor Tr1 is turned on, and the electron Eg accumulated in the green electric storage layer 110G is transferred to the FD 116. Accordingly, the green signal based on the light reception amount of the green light Lg is read to the vertical signal line Lsig which will be described later via other unillustrated pixel transistor. Thereafter, the unillustrated reset transistor and transfer transistor Tr1 are turned on, and the FD 116 that is an n-type region and an electric storage region (the n-type region 115n) of the green electric storage layer 110G may be reset, for example, to a power source voltage VDD.

[Obtaining of Blue Signal and Red Signal by Inorganic Photoelectric Conversion Sections 11B and 11R]

Subsequently, out of the light that has passed through the organic photoelectric conversion section 11G, blue light and red light are absorbed and subjected to photoelectric conversion in order in the inorganic photoelectric conversion sections 11B and 11R, respectively. An electron Eb corresponding to the incident blue light is accumulated in an n-type region (the n-type photoelectric conversion layer 111n) in the inorganic photoelectric conversion section 11B. It is to be noted that a hole is accumulated in an unillustrated p-type region. Similarly, an electron Er corresponding to the incident red light is accumulated in an n-type region (the n-type photoelectric conversion layer 112n) in the inorganic photoelectric conversion section 11R. It is to be noted that the hole is accumulated in an unillustrated p-type region.

In the electric-charge accumulation state, as described above, the negative electric potential VL is applied to the lower electrode 15a in the organic photoelectric conversion section 11G. Therefore, hole concentration in the p-type region (the p-type region 111p in FIG. 2) that is a hole accumulation layer in the inorganic photoelectric conversion section 11B tends to increase. Therefore, it is possible to suppress occurrence of a dark current in an interface of the p-type region 111p and the interlayer insulating film 12.

At the time of the reading operation, in a manner similar to that in the organic photoelectric conversion section 11G described above, the transfer transistors Tr2 and Tr3 are turned on, and the electrons Eb and Er accumulated in the n-type photoelectric conversion layers 111$n$ and 112$n$ are transferred to the FDs 113 and 114, respectively. Accordingly, a blue signal based on a light reception amount of the blue light Lb and a red signal based on a light reception amount of the red light Lr are read to the vertical signal lines Lsig which will be described later via other unillustrated pixel transistors. Thereafter, the unillustrated reset transistors and transfer transistors Tr2 and Tr3 are turned on, and the FDs 113 and 114 that are n-type regions may be reset, for example, to the power source voltage VDD.

In such a manner, by laminating the organic photoelectric conversion section 11G and the inorganic photoelectric conversion sections 11B and 11R in the vertical direction, it is possible to separately detect color lights of red, green, and blue, and to obtain signal electric charges of the respective colors, without providing a color filter. Accordingly, it is possible to suppress light loss (decrease in sensitivity) resulting from color-light absorption by the color filter, occurrence of false color accompanying the pixel interpolation process, etc.

By the way, in the photoelectric conversion device 10 as described above, it is necessary to form the upper electrode 18 configured of an inorganic film made of a material such as ITO in a predetermined pattern on the organic photoelectric conversion layer 17 configured of an organic semiconductor in the organic photoelectric conversion section 11G. Here, as a method of forming an upper electrode, other than the above-described method of using a photolithography method, for example, a method of forming a pattern with the use of a metal mask may be used, which is common. However, in the method using a metal mask, alignment accuracy may be easily decreased. Therefore, taking into consideration a margin caused by position displacement, a region in which the organic photoelectric conversion layer is formed may be decreased, and an effective pixel region (an opening rate) may be reduced. Also, dust, etc. may be generated and yield may be decreased by using a metal mask.

For such reasons, it may be desirable to process the upper electrode 18 by a photolithography method without using a metal mask as in the present embodiment. Accordingly, alignment accuracy is improved, and a wide effective pixel region is allowed to be easily secured. Also, decrease in yield due to dust, etc. is allowed to be avoided.

Comparative Examples

Figure 23:
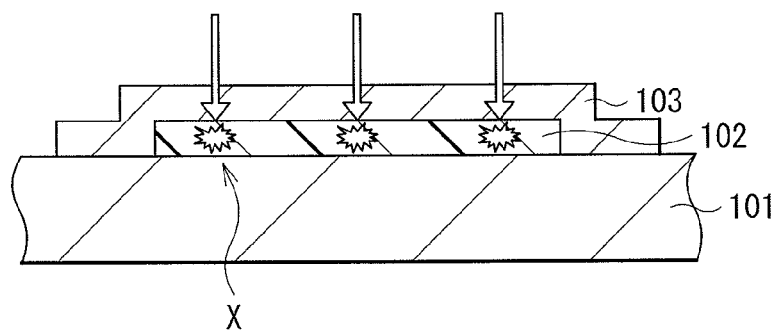
FIG. 23 is a cross-sectional view for explaining a method of processing an upper electrode according to a comparative example.

However, when the upper electrode is processed by etching using a photolithography method, the organic semiconductor may be damaged. For example, as shown in FIG. 23, when an upper electrode 103 is processed by a photolithography method to be formed on an organic semiconductor layer 102 provided on a silicon substrate 101, in a washing step after peeling off a photoresist, chemical solution may enter into the organic semiconductor layer 102 through a pin hole, etc. in the upper electrode 102. Accordingly, the organic semiconductor is damaged (X), and yield is decreased.

Figure 24A:
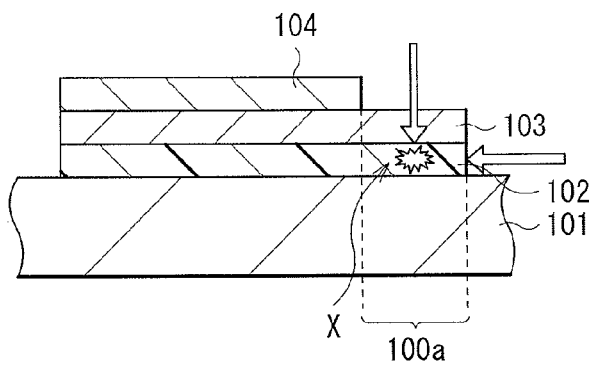
FIG. 24A is a cross-sectional view for explaining a method of processing an upper electrode according to another comparative example.
Figure 24B:
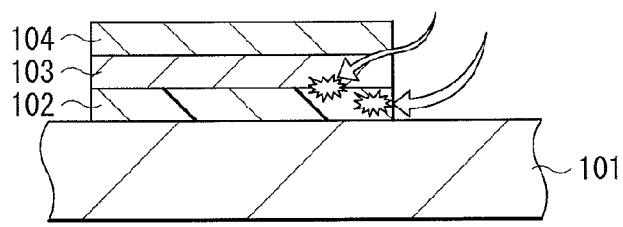
FIG. 24B is a cross-sectional view for explaining a method of processing an upper electrode according to another comparative example.

Therefore, there is a method of forming a hard mask 104 in a predetermined pattern after forming the laminated film configured of the organic semiconductor layer 102 and the upper electrode 103 as shown in FIG. 24A, and then, etching the organic semiconductor layer 102 and the upper electrode 103 with the use of the hard mask 104 as shown in FIG. 24B. However, in this method, a photolithography method is used at the time of processing the hard mask 104. Therefore, chemical solution used after the processing may enter from a surface of the upper electrode 103 and side faces of the organic semiconductor layer 102 that are exposed from the hard mask 104 (FIG. 24A). Also, after processing the upper electrode 103, the organic semiconductor layer 102 is exposed, and the chemical solution may enter from side faces of the upper electrode 103 and the side faces of the organic semiconductor layer 102 (FIG. 24B).

Therefore, in the present embodiment, as described above, the protective film 19 configured, for example, of an insulating film such as a silicon oxide film is formed on the upper electrode 18 before processing the upper electrode 18 into a predetermined shape at the time of forming the upper electrode 18. Further, the upper electrode 18 is processed by selectively removing part of the upper electrode 18 and the protective film 19 by etching using a photolithography method. At this time, the processing is performed so as to allow the peripheral edge portions of the upper electrode 18 and the protective film 19 to be on the outer side compared to the peripheral edge portion of the organic photoelectric conversion layer 17. Therefore, the organic photoelectric conversion layer 17 is not exposed in the step of processing the upper electrode 18 and the step of washing. Even when a pin hole (a defect) is caused in the upper electrode 18, the protective film 19 prevents the chemical solution from entering. Therefore, it is possible to suppress damage in the organic photoelectric conversion layer 17.

As described above, in the present embodiment, the upper electrode 18 in the organic photoelectric conversion section 11G is performed as follows in the photoelectric conversion device 10 configured of lamination of the organic photoelectric conversion section 11G and the inorganic photoelectric conversion sections 11B and 11R. Specifically, after forming the upper electrode 18 and the protective film 19 in order on the organic photoelectric conversion layer 17, the upper electrode 18 is selectively removed in an outer region compared to the peripheral edge e1 of the organic photoelectric conversion layer 17. Thus, at the time of processing the upper electrode 18, it is possible not to expose the organic photoelectric conversion layer 17, and to suppress damage in the organic photoelectric conversion layer 17. Accordingly, it is possible to improve yield and reliability in the photoelectric conversion device 10 (the semiconductor device) that has the laminated structure of the organic photoelectric conversion layer 17 (the organic semiconductor layer) and the upper electrode 18 (the inorganic film).

Next, description will be provided of modifications (Modifications 1 to 5) of the photoelectric conversion device 10 of the above-described embodiment. Hereinafter, the same symbols are attached to components similar to those in the above-described embodiment, and description thereof will be appropriately omitted.

Modification 1

FIG. 25 to FIG. 29 illustrate a method of manufacturing a photoelectric conversion device (a method of processing the upper electrode 18) according to Modification 1 in order of steps. In the processing method in the present modification, the protective film 19 formed on the upper electrode 18 is patterned, and then, this patterned protective film 18 is used as a mask to etch the upper electrode 18. It is to be noted that the method of forming the semiconductor substrate 11 and the unillustrated wiring layer 51 and support substrate 53 is similar to that in the above-described embodiment.

Figure 25:
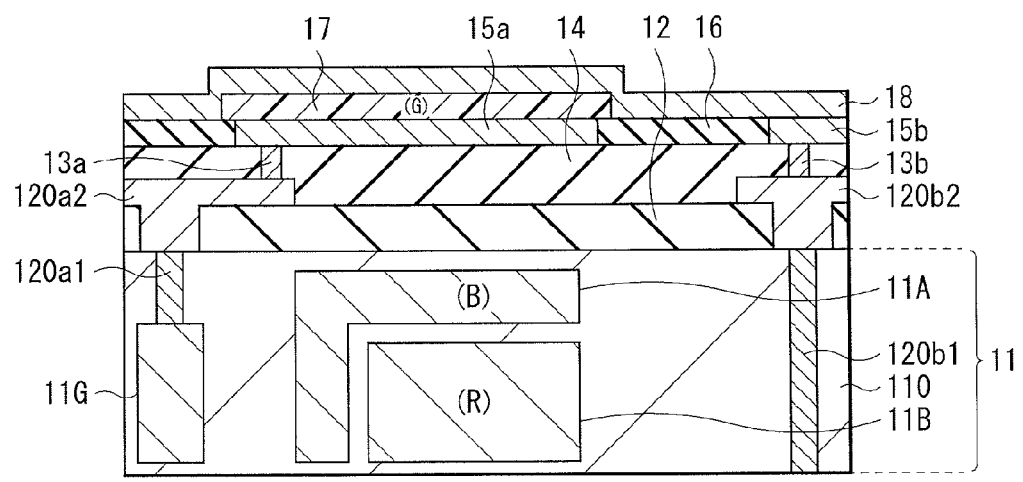
FIG. 25 is a cross-sectional view for explaining a method of manufacturing a photoelectric conversion device (a method of patterning an upper electrode) according to Modification 1.

Specifically, first, as in the above-described embodiment, as shown in FIG. 25, the upper electrode 18 is formed so as to cover the organic photoelectric conversion layer 17. At this time, the upper electrode 18 is formed to cover the top face and the side faces of the organic photoelectric conversion layer 17 as described above.

Figure 26:
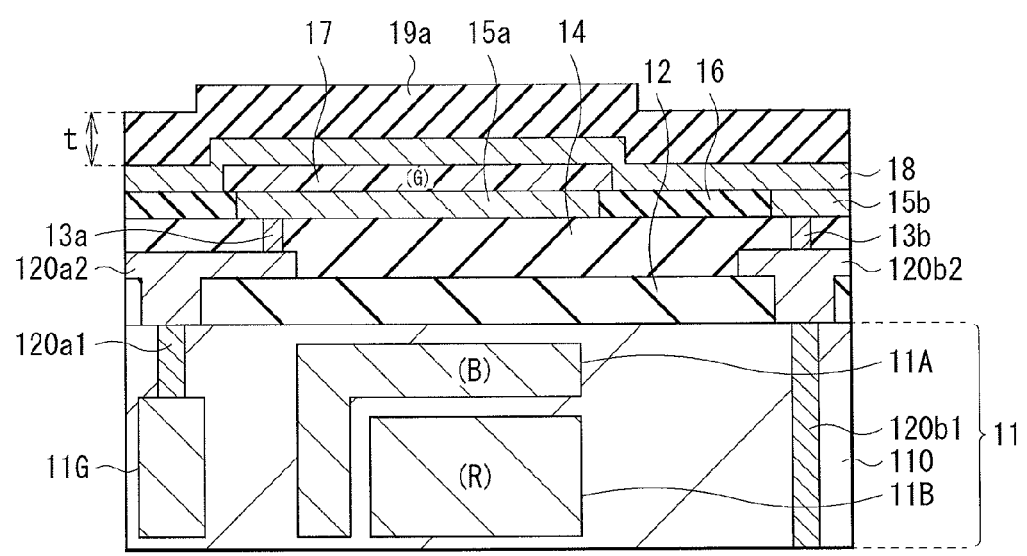
FIG. 26 is a cross-sectional view illustrating a process following FIG. 25.

Subsequently, as shown in FIG. 26, a protective film 19a is formed on the upper electrode 18. The protective film 19a is configured of a film such as a silicon oxide film, a silicon nitride film, and a silicon oxynitride film as with the protective film 19 in the above-described embodiment. However, the protective film 19a is formed with a thickness (t) in consideration of decrease in thickness in a later-stage step. This thickness t may be set so that the protective film 19a after becoming a thin film (after reduction in thickness) by etching have a remained thickness that is allowed to prevent entering of the chemical solution into the organic photoelectric conversion layer 17.

Figure 27A:
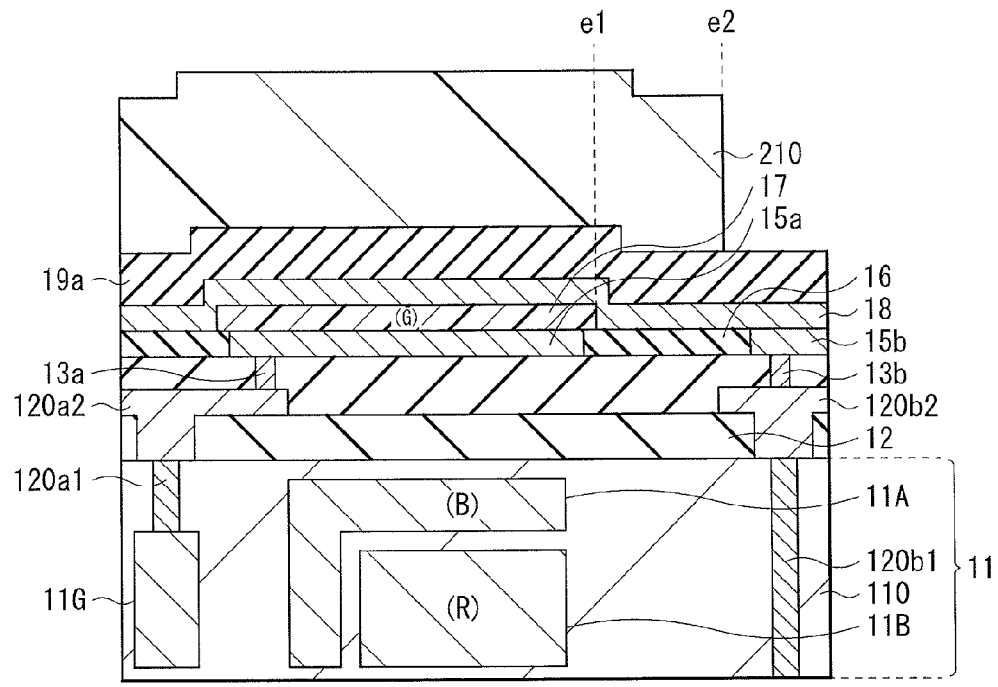
FIG. 27A is a cross-sectional view illustrating a process following FIG. 26.
Figure 27B:
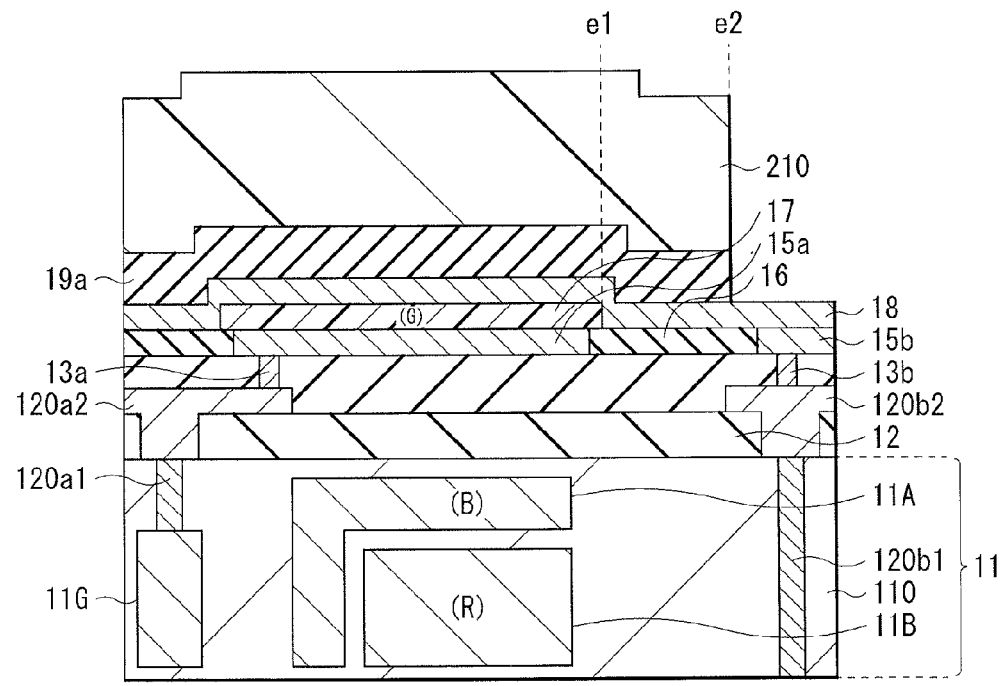
FIG. 27B is a cross-sectional view illustrating a process following FIG. 27A.

Subsequently, as shown in FIG. 27A, the photoresist 210 is formed into a pattern on the protective film 19. At this time, as in the above-described embodiment, the patterning is performed so that the peripheral edge portion (e2) of the photoresist 210 be on the outer side compared to the peripheral edge portion e2 of the organic photoelectric conversion layer 17. Thereafter, as shown in FIG. 27B, only part of the protective film 19a is selectively removed by dry etching using the photoresist 210 as a mask.

Figure 28:
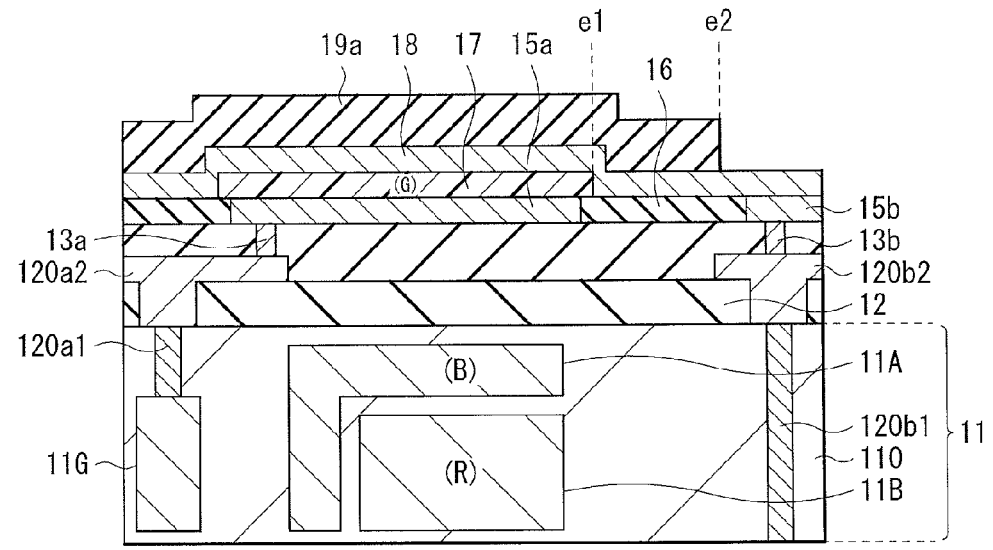
FIG. 28 is a cross-sectional view illustrating a process following FIG. 27B.

Subsequently, as shown in FIG. 28, the photoresist 210 is peeled off from the protective film 19a by ashing, and washing is performed. At the time of washing, chemical solution is used as described above. However, at this time, also in the present modification, the organic photoelectric conversion layer 17 is covered with the upper electrode 18 and the protective film 19a. Therefore, the organic photoelectric conversion layer 17 is not damaged due to entering of the chemical solution.

Figure 29:
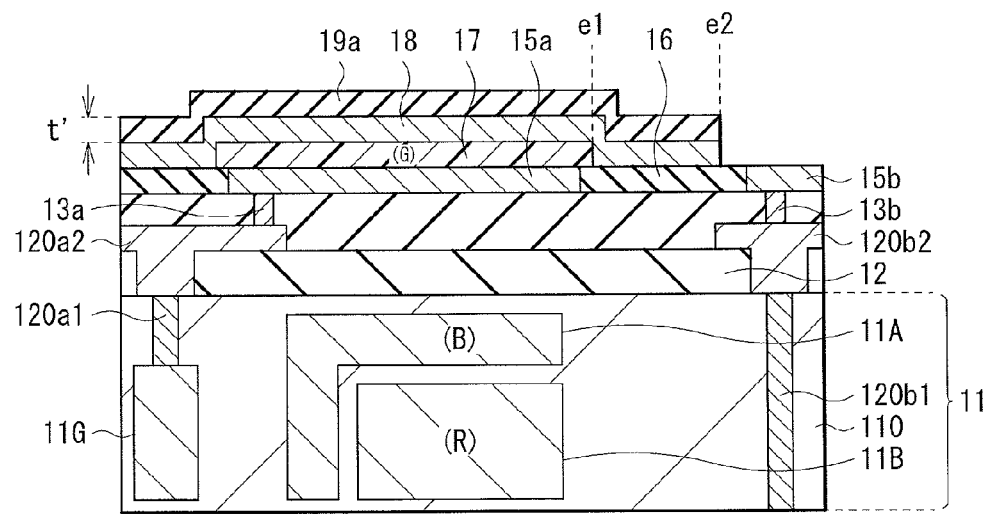
FIG. 29 is a cross-sectional view illustrating a process following FIG. 28.

Subsequently, as shown in FIG. 29, etching is performed in a position of the peripheral edge portion e2 using the patterned protective film 19a as a mask, and thereby, the upper electrode 18 is processed. Accordingly, the thickness of the protective film 19a is reduced (to have a thickness t' (<t)), and the upper electrode 18 is processed in the position of the peripheral edge portion e2. Thus, after processing the protective film 19a, the upper electrode 18 may also be allowed to be processed using this protective film 19a as a mask.

Modification 2

Figure 30A:
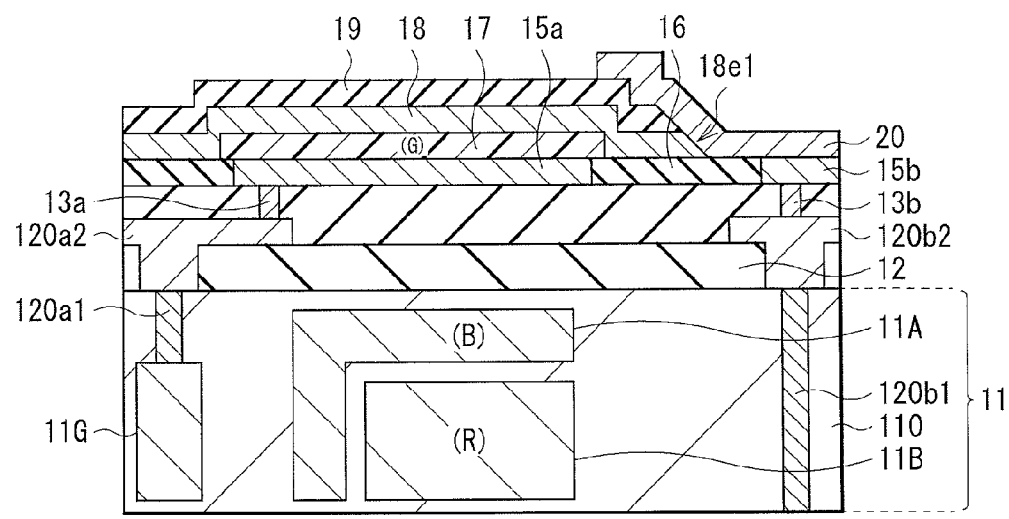
FIG. 30A is a cross-sectional view illustrating a main part configuration of a photoelectric conversion device according to Modification 2.
Figure 30B:
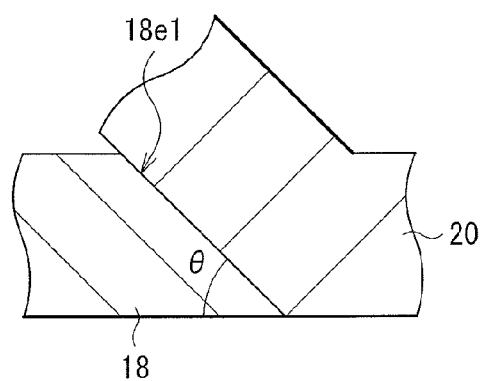
FIG. 30B is an enlarged diagram around an end portion of an upper electrode shown in FIG. 30A.

FIG. 30A illustrates a main part configuration (the organic photoelectric conversion section 11G and the semiconductor substrate 11) of a photoelectric conversion device according to Modification 2. FIG. 30B illustrates a configuration around an end portion of the upper electrode 18 in an enlarged manner. In the above-described embodiment, the contact hole H is formed in the protective film 19, and thereby, the electric connection between the upper electrode 18 and the contact metal 20 is secured. However, as in the present modification, a tapered portion 18e1 may be formed in the end portion of the upper electrode 18. The contact metal layer 20 is formed so as to cover this tapered portion 18e1 in the end portion of the upper electrode 18. A tapered angle θ of the tapered portion 18e1 may be favorably as small as possible in order to secure a contact area with the contact metal layer 20 and to improve coverage of the contact metal layer 20. The tapered angle θ of the tapered portion 18e1 may be, for example, 80° or smaller, and may be desirably 50° or smaller. Such a tapered portion 18e1 may be allowed to be formed, for example, by adjusting an etching condition when the protective film 19 and the upper electrode 18 are patterned by a photolithography method. Alternatively, such a tapered portion 18e1 may be allowed to be formed also by performing etching in a state where a shape of a side face of the photoresist is allowed to be rounder by reflow. Accordingly, it is possible to omit the step of forming the contact hole H, and therefore, the process is simplified.

Modification 3

Figure 31:
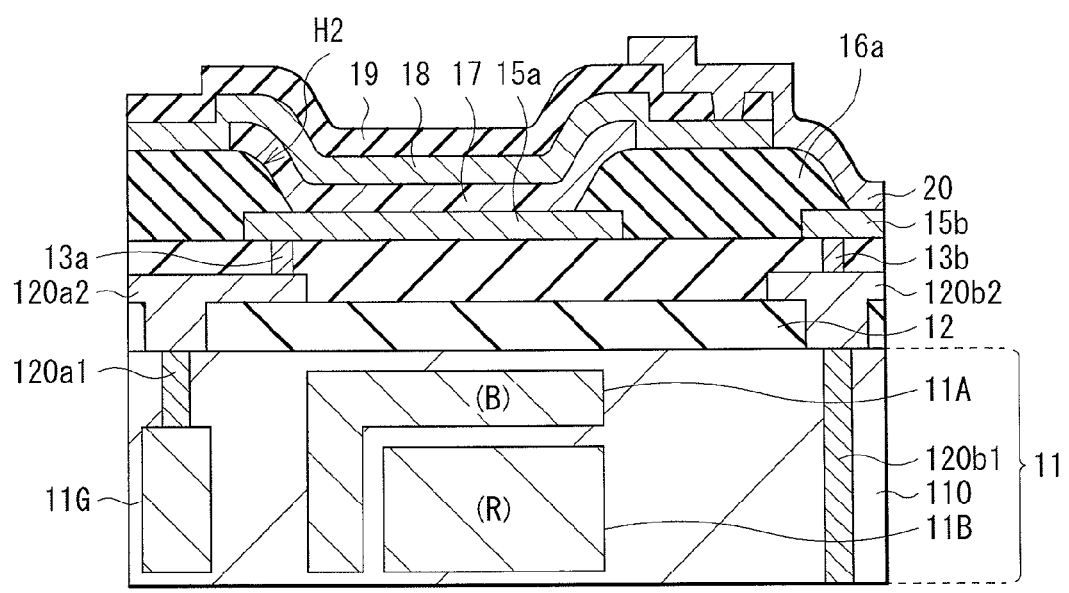
FIG. 31 is a cross-sectional view illustrating a main part configuration of a photoelectric conversion device according to Modification 3.
Figure 32A:
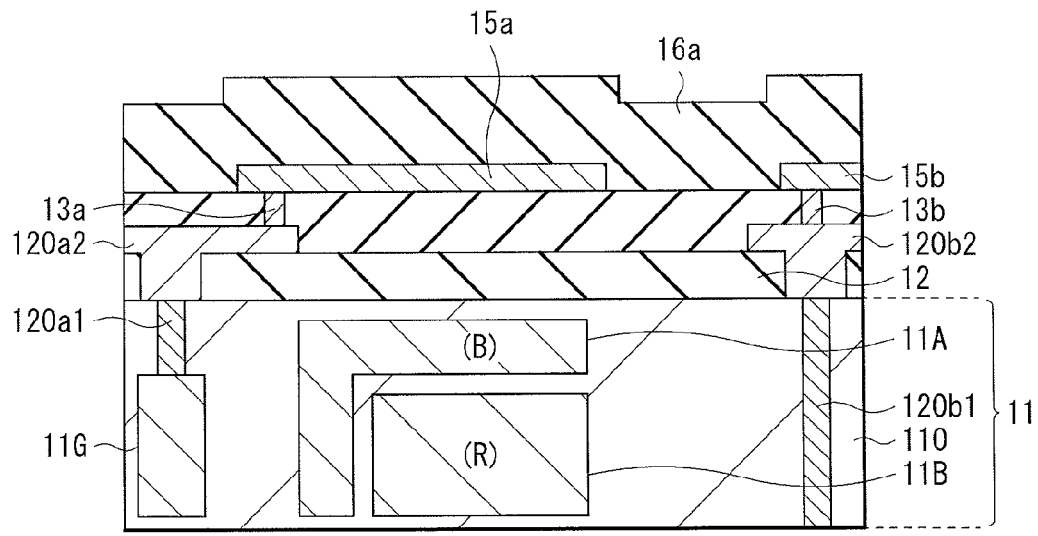
FIG. 32A is a cross-sectional view for explaining a method of manufacturing the photoelectric conversion device shown in FIG. 31 (a method of forming an insulating film).
Figure 32B:
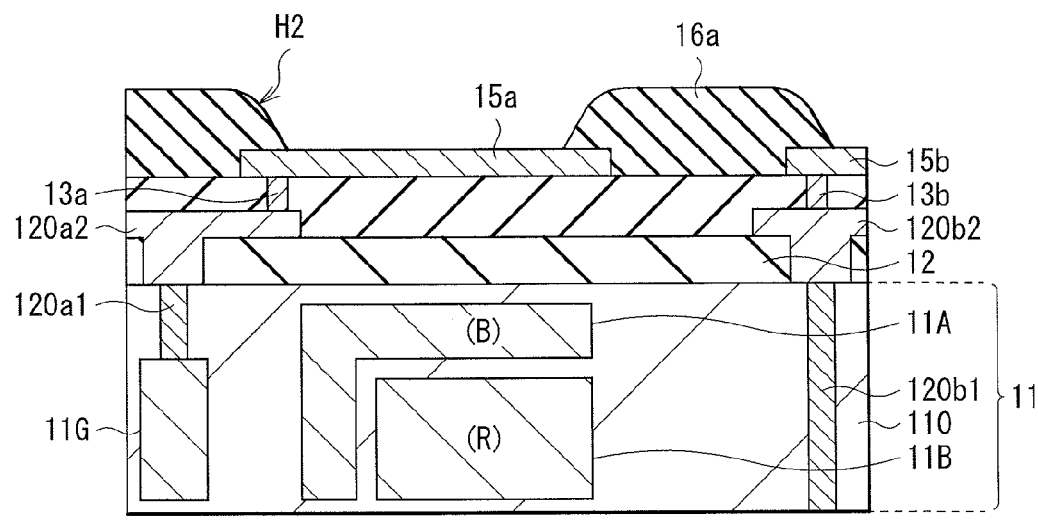
FIG. 32B is a cross-sectional view illustrating a process following FIG. 32A.

FIG. 31 illustrates a main part configuration (the organic photoelectric conversion section 11G and the semiconductor substrate 11) of a photoelectric conversion device according to Modification 3. FIG. 32A and FIG. 32B illustrate a method of manufacturing this photoelectric conversion device (a method of forming an insulating film) in order of steps. In the above-described embodiment, there has been referred to, as an example, the structure in which the insulating film 16 that electrically separates between the lower electrodes 15a is planarized and a level difference between the lower electrode 15a and the insulating film 16 is moderated. However, an insulating film 16a as shown in the present modification may be used. The insulating film 16a in the present modification is provided to have an opening H2 on the lower electrode 15a, and is different in level from the lower electrode 15a. However, side faces of the opening H2 has a moderate tapered shape. The organic photoelectric conversion layer 17 is formed in this opening H2 in the insulating film 16. Such an insulating film 16a is allowed to be formed as follows. For example, first, as shown in FIG. 32A, the insulating film 16a is formed over the entire surface of the substrate so as to cover the lower electrode 15a. Thereafter, as shown in FIG. 32B, the opening H2 is formed by etching using a photolithography method. As the insulating film 16a, photosensitive resin, etc. may be used other than the above-described materials. In this case, by performing reflow after forming the opening H2, it is possible to form a rounder shape without corners.

Modification 4

Figure 33:
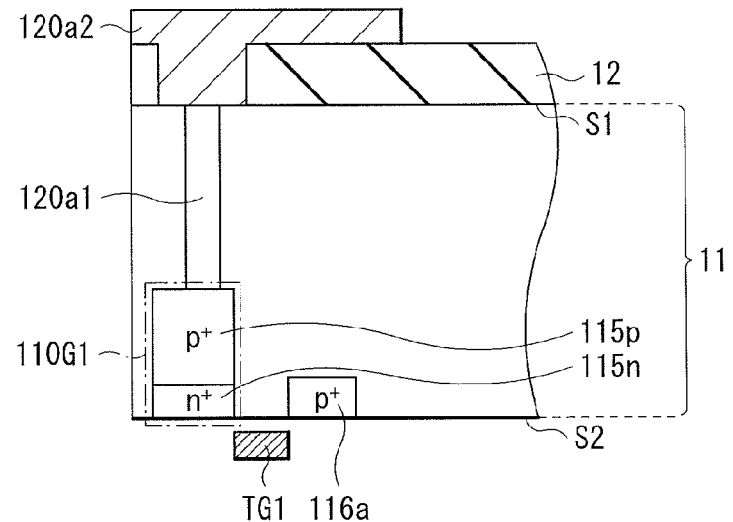
FIG. 33 is a cross-sectional view illustrating a photoelectric conversion device according to Modification 4 (lower-side hole extraction).

FIG. 33 illustrates a main part configuration (part of the semiconductor substrate 11) of a photoelectric conversion device according to Modification 4. In the above-described embodiment, description has been provided referring to, as an example, the case where an electron is extracted as the signal electric charge from the lower electrode 15a in the organic photoelectric conversion section 11G. However, the photoelectric conversion device may be configured to allow a hole to be extracted as the signal electric charge from the lower electrode 15a. In this case, the configuration on the surface S1 of the semiconductor substrate 11 may be similar to that in the above-described embodiment. However, configurations of an electric storage layer (a green electric storage layer 110G1) and a floating diffusion (a FD 116a) formed in the semiconductor substrate 11 are different from those in the above-described embodiment. Specifically, in the green electric storage layer 110G1, the p-type region 115p serving as a hole accumulation layer is connected to the electrically-conductive plug 120a1, and the n-type region 115n to be an electron accumulation layer is formed near an interface of this p-type region 115p and the surface S2. Further, the FD 116a is formed as a p-type region. It is to be noted that, in an electric-charge accumulation state, an electric potential VL lower than the upper electrode 18 is applied to the lower electrode 15a. Accordingly, a hole out of the pair of an electron and a hole generated in the organic photoelectric conversion layer 17 is guided to the lower electrode 15a side, and the hole is extracted from the lower electrode 15a. This hole is accumulated in the p-type region 115p in the green electric storage layer 110G1 via the electrically-conductive plugs 120a1 and 120a2, etc. This accumulated hole is transferred to the FD 116a at the time of the reading operation.

Modification 5

Figure 34:
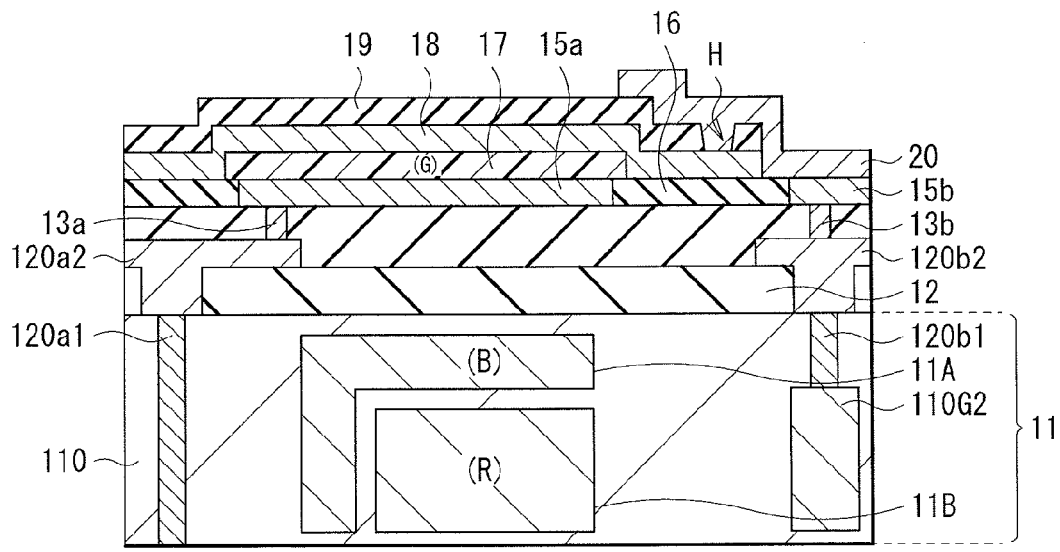
FIG. 34 is a cross-sectional view illustrating a photoelectric conversion device according to Modification 5 (upper-side hole extraction).

FIG. 34 illustrates a main part configuration (the organic photoelectric conversion section 11G and the semiconductor substrate 11) of a photoelectric conversion device according to Modification 5. In the above-described embodiment and Modification 4, description has been provided referring to, as an example, the case where the signal electric charge (the electron or the hole) is extracted from the lower electrode 15a in the organic photoelectric conversion section 11G. However, the photoelectric conversion device may be configured to extract the signal electric charge from the upper electrode 18. In this case, there is adopted a configuration in which a green electric storage layer 110G2 formed embedded in the semiconductor substrate 11 is connected to the electrically-conductive plug 120b1, and is conducted to the upper electrode 18 via the electrically-conductive plug 120b2, the wiring layers 13b and 15b, and the contact metal layer 20. It is to be noted that, by setting a configuration of the green electric storage layer 110G2 and a conductivity type of an FD (which is not illustrated) similarly to those in the above-described embodiment, and by setting an electric potential to be applied to the upper electrode 18 to be higher than an electric potential to be applied to the lower electrode 15a at the time of electric charge accumulation, it is possible to extract an electron as the signal electric charge from the upper electrode 18 and to accumulate the extracted electron in the green electric storage layer 110G2. In this case, the hole is discharged from the lower electrode 15a side via the wiring layer 13a, and the electrically-conductive plugs 120a1 and 120a2. Alternatively, by setting the configuration of the green electric storage layer 110G2 and the conductivity type of the FD (which is not illustrated) similarly to those in the above-described Modification 4, and by setting an electric potential to be applied to the upper electrode 18 to be lower than an electric potential to be applied to the lower electrode 15a at the time of electric charge accumulation, it is possible to extract a hole as the signal electric charge from the upper electrode 18 and to accumulate the extracted hole in the green electric storage layer 110G2. In this case, the electron is discharged from the lower electrode 15a side via the wiring layer 13a, and the electrically-conductive plugs 120a1 and 120a2.

Application Example 1

Figure 35:
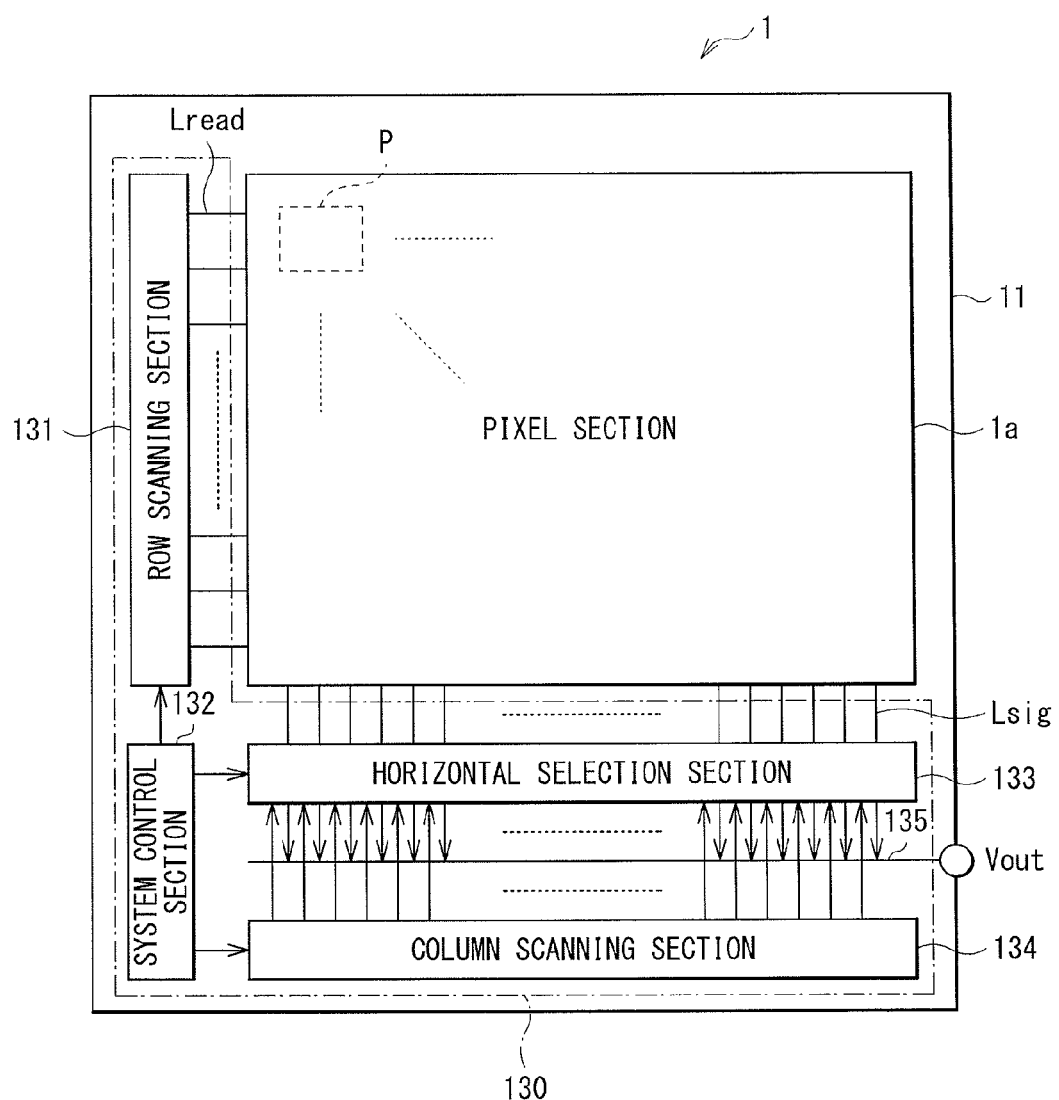
FIG. 35 is a functional block diagram of a solid-state imaging unit that uses the photoelectric conversion device shown in FIG. 1 as a pixel.

FIG. 35 illustrates a general configuration of a solid-state imaging unit (a solid-state imaging unit 1) that uses the photoelectric conversion device described in the above embodiment, modifications, etc. for each pixel. This solid-state imaging unit 1 is a CMOS image sensor. The solid-state imaging unit 1 includes a pixel section 1a as an imaging area on the semiconductor substrate 11. The solid-state imaging unit 1 may also include, in a peripheral region of this pixel section 1a, for example, a peripheral circuit section 130 configured of a row scanning section 131, a horizontal selection section 133, a horizontal selection section 134, and a system control section 132.

The pixel section 1a may include, for example, a plurality of unit pixels P (corresponding to the photoelectric conversion devices 10) that are arranged two-dimensionally in a matrix. To this unit pixels P, for example, pixel drive lines Lread (specifically, row selection lines and reset control lines) may be wired on a pixel-row basis, and vertical signal lines Lsig are wired on a pixel-column basis. The pixel drive line Lread transmits a drive signal for reading a signal from the pixel. One end of the pixel drive line Lread is connected to an output terminal corresponding to each row in the row scanning section 131.

The row scanning section 131 is configured of a shift register, an address decoder, etc. The row scanning section 131 may be, for example, a pixel drive section that drives the respective pixels P in the pixel section 1a on a row-unit basis. Signals outputted from the respective pixels P in the pixel row selectively scanned by the row scanning section 131 are supplied to the horizontal selection section 133 via the respective vertical signal lines Lsig. The horizontal selection section 133 is configured of an amplifier, a horizontal selection switch, etc. that are provided for each vertical signal line Lsig.

The horizontal selection section 134 is configured of a shift register, an address decoder, etc. The horizontal selection section 134 sequentially drives the respective horizontal selection switches in the horizontal selection section 133 while scanning the respective horizontal selection switches in the horizontal selection section 133. Due to this selective scanning by the horizontal selection section 134, signals of the respective pixels transmitted via the respective vertical signal lines Lsig are sequentially outputted to horizontal signal lines 19, and are transmitted to outside of the substrate 11 via the horizontal signal lines 19.

The circuit part configured of the row scanning section 131, the horizontal selection section 133, the horizontal selection section 134, and the horizontal signal lines 19 may be formed directly on the substrate 11, or may be arranged in an external control IC. Alternatively, that circuit part may be formed on another substrate connected with the use of a cable, etc.

The system control section 132 receives a clock, data instructing an operation mode, etc. that are supplied from the outside of the substrate 11. The system control section 132 also outputs data such as internal information of a radiation imaging unit 1. Further, the system control section 132 includes a timing generator that generates various timing signals, and performs drive control of peripheral circuits such as the row scanning section 131, the horizontal selection section 133, and the horizontal selection section 134 based on the various timing signals generated by the timing generator.

Application Example 2

Figure 36:
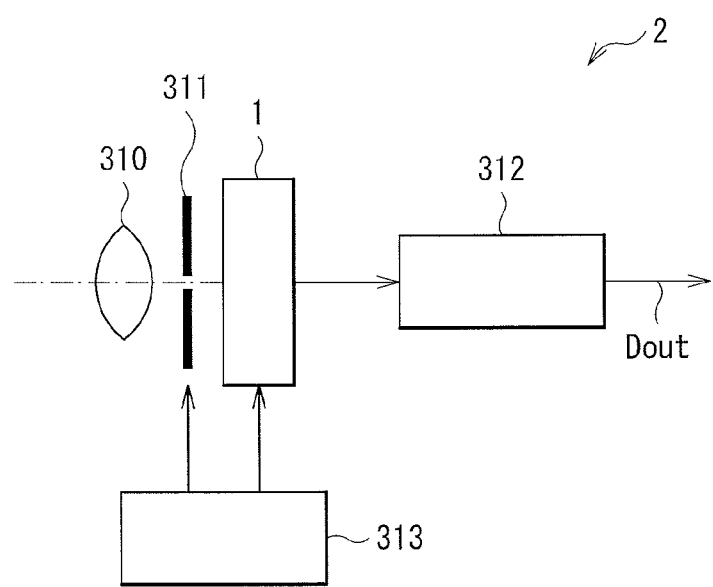
FIG. 36 is a block diagram illustrating a schematic configuration of an electronic apparatus that uses the solid-state imaging unit shown in FIG. 35.

The above-described solid-state imaging unit 1 may be applicable to any type of electronic apparatus having an imaging function, for example, a camera system such as a digital still camera and a video camcorder, a mobile phone having an imaging function, etc. FIG. 36 illustrates a schematic configuration of an electronic apparatus 2 (a camera) as an example thereof. This electronic apparatus 2 may be, for example, a video camcorder that is capable of shooting a still image or a moving image. The electronic apparatus 2 may include the solid-state imaging unit 1, an optical system (an optical lens) 310, a shutter unit 311, a drive section 313 that drives the solid-state imaging unit 1 and the shutter unit 311, and a signal processing section 312.

The optical system 310 guides image light (incident light) from a subject to the pixel section 1a in the solid-state imaging unit 1. This optical system 310 may be configured of a plurality of optical lenses. The shutter unit 311 controls periods of light irradiation and light blocking with respect to the solid-state imaging unit 1. The drive section 313 controls a transfer operation of the solid-state imaging unit 1 and a shutter operation of the shutter unit 311. The signal processing section 312 performs various signal processes on a signal outputted from the solid-state imaging unit 1. An image signal Dout after the signal processing is stored in a storing medium such as a memory, or outputted to a monitor, etc.

Hereinabove, description has been provided referring to the embodiment and the modifications. However, content of the present disclosure is not limited to the above-described embodiment and the like, and various modifications may be made. For example, in the above-described embodiment and the like, the photoelectric conversion device (the solid-state imaging unit) has a configuration in which the organic photoelectric conversion section 11G that detects green light, and the inorganic photoelectric conversion sections 11B and 11R that detect blue light and red light, respectively, are laminated. However, the content of the present disclosure is not limited to such a structure. Specifically, red or blue light may be detected in the organic photoelectric conversion section, and green light may be detected in the inorganic photoelectric conversion section. Moreover, the numbers, ratio, etc. of these organic and inorganic photoelectric conversion sections are not limited either. Two or more organic photoelectric conversion sections may be provided, or color signals of a plurality of colors may be obtained only by the organic photoelectric conversion sections. Moreover, the organic photoelectric conversion section and the inorganic photoelectric conversion section are not limited to have a vertically-laminated structure, and may be arranged side by side along the substrate surface.

Moreover, in the above-described embodiment and the like, the configuration of the back-illumination-type solid-state imaging unit has been described as an example. However, the content of the present disclosure is applicable also to a front-illumination-type solid-state imaging unit.

Moreover, in the above-described embodiment and the like, the photoelectric conversion device is referred to as an example of the semiconductor device in the present disclosure. However, the present disclosure is also applicable, in addition thereto, various semiconductor devices having a laminated structure in which an inorganic film is formed into a pattern on an organic semiconductor, for example, an organic thin-film transistor, an organic electroluminescence device, etc.

Moreover, the solid-state imaging unit (the photoelectric conversion device) in the present disclosure does not necessarily include all of the components described in the above embodiment, and in reverse, may include other layer.

It is to be noted that the present disclosure may have the following configurations.
(1) A semiconductor device including:
  in order on a substrate,
  an organic semiconductor layer;
  an inorganic film; and
  a protective film,
  the inorganic film and the protective film each having a peripheral edge portion that is formed in an outer region compared to a peripheral edge portion of the organic semiconductor layer.
(2) The semiconductor device according to (1), including:
  in order on the substrate,
  a first electrode;
  the organic semiconductor layer; and
  a second electrode serving as the inorganic film,
  the organic semiconductor layer having a photoelectric conversion function.
(3) The semiconductor device according to (2), further including:
  a contact hole provided in a region, in the protective film, opposing the second electrode and not opposing the organic semiconductor layer; and
  a contact metal layer electrically connected to the second electrode via the contact hole.
(4) The semiconductor device according to (2), wherein
  an end portion of the second electrode has a tapered portion, and
  a contact metal layer is provided covering the end portion of the second electrode.
(5) The semiconductor device according to any one of (1) to (4), wherein the protective film is a single-layer film configured of one of silicon nitride, silicon oxide, and silicon oxynitride, or is a laminated film configured of two or more of the silicon nitride, silicon oxide, and silicon oxynitride.
(6) The semiconductor device according to any one of (2) to (5), wherein the first electrode and the second electrode are each configured of a transparent electrically-conductive film.
(7) A method of manufacturing a semiconductor device, the method including:
  forming an organic semiconductor layer on a substrate;
  forming an inorganic film and a protective film in order on the organic semiconductor layer; and
  selectively removing part of the inorganic film and part of the protective film in an outer region compared to a peripheral edge portion of the organic semiconductor layer, and thereby processing the inorganic film.
(8) The method of manufacturing the semiconductor device according to (7), wherein, in the processing of the inorganic film, the part of the protective film and the part of the inorganic film are collectively removed by etching using a photolithography method.
(9) The method of manufacturing the semiconductor device according to (7) or (8), wherein, in the processing of the inorganic film, the part of the protective film is removed by etching using a photolithography method, and then, the part of the inorganic film is removed by etching using the protective film as a mask.
(10) The method of manufacturing the semiconductor device according to any one of (7) to (9), wherein
  a first electrode, the organic semiconductor layer, and a second electrode as the inorganic film are formed in order on the substrate, and
  a photoelectric conversion material is used as the organic semiconductor layer.
(11) The method of manufacturing the semiconductor device according to (10), wherein, after forming the second electrode, a contact hole is formed in a region, in the protective film, opposing the second electrode and not opposing the organic semiconductor layer, and a contact metal layer is formed, the contact metal layer being electrically connected to the second electrode via the contact hole.
(12) The method of manufacturing the semiconductor device according to (10), wherein, after forming the second electrode, a tapered portion is formed in an end portion of the second electrode, and a contact metal layer is formed to cover the end portion of the second electrode.
(13) A solid-state imaging unit including pixels each including one or a plurality of organic photoelectric conversion sections,
  the one or the plurality of organic photoelectric conversion sections each including, in order on a substrate, a first electrode, an organic semiconductor layer having a photoelectric conversion function, a second electrode, and a protective film, and the inorganic film and the protective film each having a peripheral edge portion that is formed in an outer region compared to a peripheral edge portion of the organic semiconductor layer.

(14) The solid-state imaging unit according to (13), further including:
a contact hole provided in a region, in the protective film, opposing the second electrode and not opposing the organic semiconductor layer; and
a contact metal layer electrically connected to the second electrode via the contact hole.

(15) The solid-state imaging unit according to (13), wherein
an end portion of the second electrode has a tapered portion, and
a contact metal layer is provided covering the end portion of the second electrode.

(16) The solid-state imaging unit according to any one of (13) to (15), wherein, in each of the pixels, the one or the plurality of organic photoelectric conversion sections and one or a plurality of inorganic photoelectric conversion sections are laminated, the one or the plurality of inorganic photoelectric conversion sections each performing photoelectric conversion in a wavelength range different from a wavelength range of the organic photoelectric conversion section.

(17) The solid-state imaging unit according to (16), wherein
the inorganic photoelectric conversion section is formed to be embedded in a semiconductor substrate, and
the organic photoelectric conversion section is formed on a first face side of the semiconductor substrate.

(18) The solid-state imaging unit according to (17), wherein a multi-layered wiring layer is formed on a second face side of the semiconductor substrate.

(19) The solid-state imaging unit according to (17) or (18), wherein
the organic photoelectric conversion section performs photoelectric conversion of green light, and
an inorganic photoelectric conversion section performing photoelectric conversion of blue light and an inorganic photoelectric conversion section performing photoelectric conversion of red light are laminated in the semiconductor substrate.

(20) An electronic apparatus with a solid-state imaging unit, the solid-state imaging unit including pixels each including one or a plurality of organic photoelectric conversion sections,
the one or the plurality of organic photoelectric conversion sections each including, in order on a substrate, a first electrode, an organic semiconductor layer having a photoelectric conversion function, a second electrode, and a protective film, and
the inorganic film and the protective film each having a peripheral edge portion that is formed in an outer region compared to a peripheral edge portion of the organic semiconductor layer.

This application claims priority on the basis of Japanese Patent Application JP 2011-285353 filed Dec. 27, 2011, the entire contents of each which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device comprising:
in order on a substrate,
an organic semiconductor layer;
an inorganic film; and
a protective film,
the inorganic film and the protective film each having a peripheral edge portion that is formed in an outer region compared to a peripheral edge portion of the organic semiconductor layer, and
wherein an end portion of the inorganic film has a tapered portion.

2. The semiconductor device according to claim 1, comprising:
in order on the substrate,
a first electrode;
the organic semiconductor layer; and
a second electrode serving as the inorganic film,
the organic semiconductor layer having a photoelectric conversion function.

3. The semiconductor device according to claim 2, further comprising:
a contact hole provided in a region, in the protective film, opposing the second electrode and not opposing the organic semiconductor layer; and
a contact metal layer electrically connected to the second electrode via the contact hole.

4. The semiconductor device according to claim 2, wherein
a contact metal layer is provided covering the end portion of the second electrode.

5. The semiconductor device according to claim 1, wherein the protective film is a single-layer film configured of one of silicon nitride, silicon oxide, and silicon oxynitride, or is a laminated film configured of two or more of the silicon nitride, silicon oxide, and silicon oxynitride.

6. The semiconductor device according to claim 2, wherein the first electrode and the second electrode are each configured of a transparent electrically-conductive film.

7. A solid-state imaging unit comprising pixels each including one or a plurality of organic photoelectric conversion sections,
the one or the plurality of organic photoelectric conversion sections each including, in order on a substrate, a first electrode, an organic semiconductor layer having a photoelectric conversion function, a second electrode, and a protective film,
the second electrode and the protective film each having a peripheral edge portion that is formed in an outer region compared to a peripheral edge portion of the organic semiconductor layer, and
wherein an end portion of the second electrode has a tapered portion.

8. The solid-state imaging unit according to claim 7, further comprising:
a contact hole provided in a region, in the protective film, opposing the second electrode and not opposing the organic semiconductor layer; and
a contact metal layer electrically connected to the second electrode via the contact hole.

9. The solid-state imaging unit according to claim 7, wherein
a contact metal layer is provided covering the end portion of the second electrode.

10. The solid-state imaging unit according to claim 7, wherein, in each of the pixels, the one or the plurality of organic photoelectric conversion sections and one or a plurality of inorganic photoelectric conversion sections are laminated, the one or the plurality of inorganic photoelectric conversion sections each performing photoelectric conversion in a wavelength range different from a wavelength range of the one or the plurality of organic photoelectric conversion sections.

11. The solid-state imaging unit according to claim 10, wherein
the one or the plurality of inorganic photoelectric conversion sections are formed to be embedded in a semiconductor substrate, and
the one or the plurality of organic photoelectric conversion sections are formed on a first face side of the semiconductor substrate.

12. The solid-state imaging unit according to claim 11, wherein a multi-layered wiring layer is formed on a second face side of the semiconductor substrate.

13. The solid-state imaging unit according to claim 11, wherein
the one of the one or the plurality of organic photoelectric conversion sections performs photoelectric conversion of green light, and
a first inorganic photoelectric conversion section of the one or the plurality of inorganic photoelectric conversion sections performing photoelectric conversion of blue light and a second inorganic photoelectric conversion section of the one or the plurality of inorganic photoelectric conversion sections performing photoelectric conversion of red light are laminated in the semiconductor substrate.

14. An electronic apparatus with a solid-state imaging unit, the solid-state imaging unit comprising pixels each including one or a plurality of organic photoelectric conversion sections,
the one or the plurality of organic photoelectric conversion sections each including, in order on a substrate, a first electrode, an organic semiconductor layer having a photoelectric conversion function, a second electrode, and a protective film,
the second electrode and the protective film each having a peripheral edge portion that is formed in an outer region compared to a peripheral edge portion of the organic semiconductor layer, and
wherein an end portion of the second electrode has a tapered portion.

* * * * *